(12) United States Patent
Gutierrez

(10) Patent No.: US 10,368,021 B2
(45) Date of Patent: Jul. 30, 2019

(54) SYSTEMS AND METHODS FOR DERIVATIVE SENSING USING FILTERING PIXELS

(71) Applicant: MEMS Start, LLC, Arcadia, CA (US)

(72) Inventor: Roman Gutierrez, Arcadia, CA (US)

(73) Assignee: MEMS Start, LLC, Arcadia, CA (US)

( * ) Notice: Subject to any disclaimer, the term of this patent is extended or adjusted under 35 U.S.C. 154(b) by 0 days.

(21) Appl. No.: 15/678,032

(22) Filed: Aug. 15, 2017

(65) Prior Publication Data
US 2018/0091750 A1    Mar. 29, 2018

Related U.S. Application Data

(60) Provisional application No. 62/380,212, filed on Aug. 26, 2016.

(51) Int. Cl.
| | | |
|---|---|---|
| H04N 5/217 | (2011.01) | |
| H04N 5/369 | (2011.01) | |
| H01L 27/146 | (2006.01) | |
| H04N 5/353 | (2011.01) | |
| H04N 5/357 | (2011.01) | |
| H04N 5/378 | (2011.01) | |
| H04N 5/3745 | (2011.01) | |

(52) U.S. Cl.
CPC ......... *H04N 5/3696* (2013.01); *H01L 27/146* (2013.01); *H04N 5/3535* (2013.01); *H04N 5/3575* (2013.01); *H04N 5/378* (2013.01); *H04N 5/3745* (2013.01)

(58) Field of Classification Search
CPC .................................................. H04N 5/3696
USPC ........................................................ 348/241
See application file for complete search history.

(56) References Cited

U.S. PATENT DOCUMENTS

| | | | | |
|---|---|---|---|---|
| 4,577,097 | A * | 3/1986 | Keyes, IV | G05B 11/42 250/214 R |
| 5,814,803 | A * | 9/1998 | Olmstead | G06K 7/10702 235/454 |
| 2003/0173647 | A1 | 9/2003 | Montelius et al. | |
| 2003/0197445 | A1 | 10/2003 | Ives | |
| 2004/0056742 | A1 | 3/2004 | Dabbaj | |
| 2004/0174449 | A1* | 9/2004 | Lee | H04N 5/3597 348/308 |
| 2004/0264847 | A1 | 12/2004 | Koh et al. | |
| 2007/0278420 | A1 | 12/2007 | Molhave | |
| 2008/0180821 | A1 | 7/2008 | Niendorf et al. | |
| 2009/0079862 | A1 | 3/2009 | Subbotin | |

(Continued)

OTHER PUBLICATIONS

International Search Report for PCT/US2017/026457, dated Aug. 11, 2017 (4 pages).

(Continued)

*Primary Examiner* — Usman A Khan

(74) *Attorney, Agent, or Firm* — Sheppard Mullin Richter & Hampton LLP

(57) ABSTRACT

Embodiments of the technology disclosed herein provide filtering pixels for performing filtering of signals within the pixel domain. Filtering pixels described herein include a hybrid analog-digital filter within the pixel circuitry, reducing the need for computationally intensive and inefficient post-processing of images to filter out aspects of captured signals, and account for ineffectiveness of optical filters.

19 Claims, 29 Drawing Sheets

(56) References Cited

U.S. PATENT DOCUMENTS

| | | | | |
|---|---|---|---|---|
| 2011/0062314 A1* | 3/2011 | Doege | .............. | H01L 27/14643 |
| | | | | 250/214 R |
| 2013/0091315 A1* | 4/2013 | Ken | ................... | G06F 13/4018 |
| | | | | 710/307 |
| 2015/0069829 A1* | 3/2015 | Dulle | ..................... | B60R 16/03 |
| | | | | 307/9.1 |
| 2016/0372801 A1* | 12/2016 | Clemente | ......... | H01M 10/4264 |
| 2017/0302197 A1 | 10/2017 | Gutierrez | | |

OTHER PUBLICATIONS

International Search Report for PCT/US2017/048742, dated Jan. 12, 2018 (4 pages).
International Preliminary Report on Patentability in PCT/US2017/048742, dated Feb. 26, 2019.

* cited by examiner

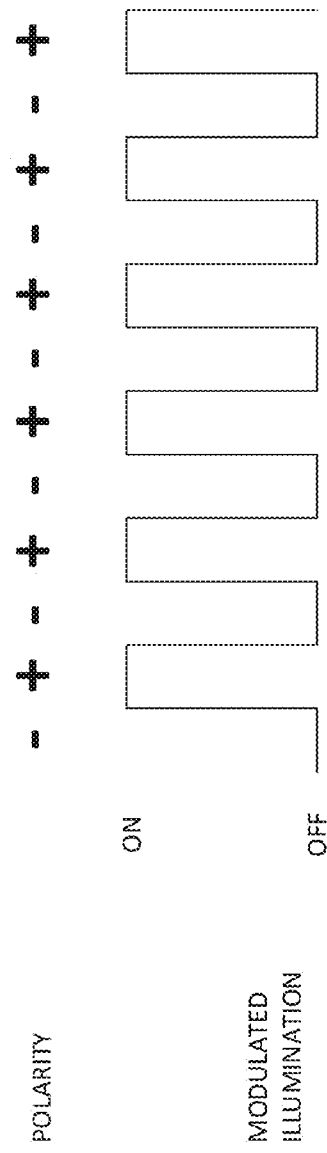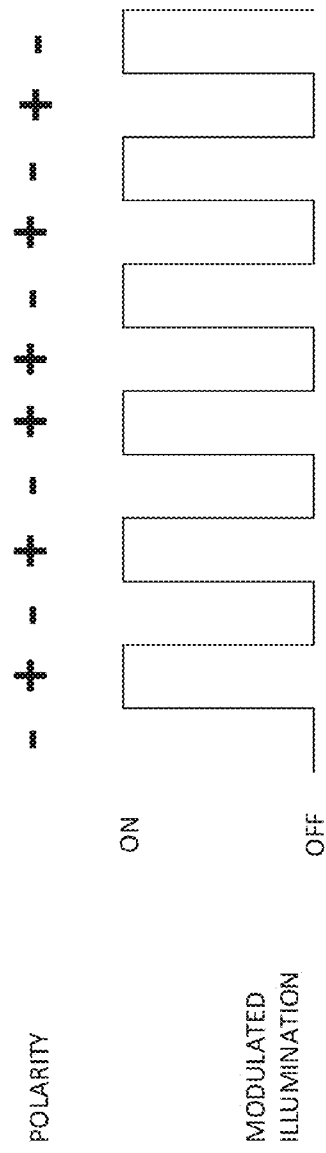

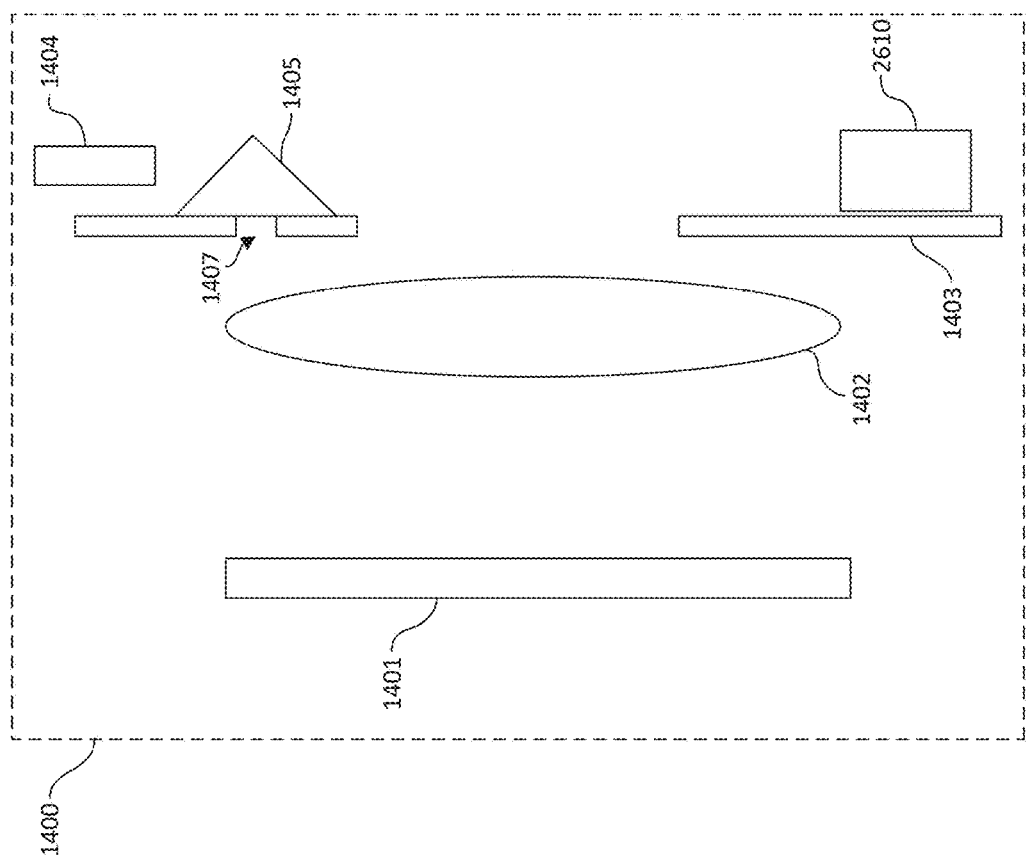

2700

| | 1 | 2 | | | | | | | |
|---|---|---|---|---|---|---|---|---|---|
| | 3 | 4 | | | | | | | |
| | | | | | | | | | |
| | | | | | | | | | |
| | | | | | | | | | |
| | | | | | | | | | |
| | | | | | | | | | |
| | | | | | | | | | |
| | | | | | | | | | |
| | | | | | | | | | |

FIG. 27

SYSTEMS AND METHODS FOR DERIVATIVE SENSING USING FILTERING PIXELS

CROSS-REFERENCE TO RELATED APPLICATIONS

This application claims the benefit of U.S. Provisional Application No. 62/380,212, filed Aug. 26, 2016, and which is incorporated herein by reference in its entirety.

TECHNICAL FIELD

The disclosed technology relates generally to image sensing and sensors, and more particularly, some embodiments relate to image sensors including pixels with embedded filtering capabilities for extracting information from an image, such as, for example capturing and identifying motion within the field of view of the image sensor.

DESCRIPTION OF THE RELATED ART

Conventional camera solutions for measuring movement rely on frame subtraction to obtain the measurement. Conventional cameras capture all the elements of a scene, which are captured in frames. For example, changes in the position of objects within a field of view (FOV) of a camera can be identified by comparing frames, e.g., subtracting subsequent frames from a current frame. This same technique is utilized for various types of motion analysis, such as gesture recognition, obstacle avoidance, target tracking, and autofocus.

Image sensors comprise a plurality of pixels that convert captured light within an image into a current. Traditional pixels comprise a photodetector and, with respect to active pixel sensors, an amplifier. The total light intensity falling on each photodetector is captured, without any differentiation between the wavelength or source of the light. External filters, like Bayer filters, may be added to an image sensor to filter out undesired light prior to reaching the photodetector of each pixel.

BRIEF SUMMARY OF EMBODIMENTS

In some embodiments, an apparatus may comprise an array of filtering pixels. Each filtering pixel may comprise: a photodiode; a filter circuit; and a read out field-effect transistor (FET). The apparatus may further comprise a read bus for reading an output of each filtering pixel of the array of filtering pixels.

In some embodiments, the array of filtering pixels comprises one or more derivative pixels, the filter circuit comprising a first differentiator configured to output a signal proportional to a change in intensity of light falling on the photodiode. The first differentiator may comprise: a capacitor; a resistor; and a field-effect transistor.

In some embodiments, each derivative pixel further comprising a reset FET configured to enable setting a voltage of the photodiode equivalent to a drain voltage of the system.

In some embodiments, each derivative pixel further comprising a buffer electrically disposed between the photodiode and the derivative sensing circuit.

In some embodiments, the buffer comprises: a buffer FET; and a preliminary differentiator configured to output a signal proportional to an intensity of light falling on the photodiode.

In some embodiments, each derivative pixel further comprises a second differentiator configured to output a signal proportional to a change in the change in intensity of light falling on the photodiode, the second differentiator electrically disposed after the first differentiator.

In some embodiments, the read bus is configured for reading out an output of the second differentiator, and each derivative pixel further comprises a second read out FET and a second read out bus for reading out an output of the first differentiator.

In some embodiments, each derivative pixel further comprises a second differentiator configured to output a signal proportional to a change in the change in intensity of light falling on the photodiode, the second differentiator electrically disposed after the first differentiator.

In some embodiments, the read bus is configured for reading out an output of the second differentiator, and each derivative pixel further comprises a second read out FET and second read out bus for reading out an output of the first differentiator.

In some embodiments, each filtering pixel may further comprise an integrator, wherein the integrator comprises a capacitor. In some embodiments, each filtering pixel may further comprise a third read out FET and a third read bus configured to output a signal proportional to the intensity of light falling on the photodiode.

In accordance with one embodiment, method of derivative sensing may comprise sensing a change in intensity of light falling on a photodiode of a derivative pixel of an array of derivative pixels. The method may further comprise taking, by a differentiator, a derivative of a signal proportional to an intensity of light falling on the photodiode. Further still, the method may comprise integrating the derivative signal, and reading out the integrated signal on a read bus.

In some embodiments, the differentiator may comprise a capacitor, a resistor, and a field-effect transistor.

In some embodiments, the method may further comprise storing, by a buffer field effect transistor, a signal proportional to an integral of the intensity of light falling on the photodiode. In some embodiments, the method may further comprise taking a second derivative of the signal by a second differentiator disposed after the first differentiator.

In some embodiments, the second differentiator may comprise a second capacitor, a second resistor, and a second field-effect transistor. In some embodiments, the integrated signal comprises an output of the second differentiator integrated by an integrator, wherein the integrator comprises a capacitor.

In some embodiments, the method may further comprise integrating an output of the first differentiator, and reading out the integrated output of the first differentiator on a second read out bus.

In accordance with one embodiment, a system may comprise an array of filtering pixels. Each filtering pixel may comprise a photodiode, a filter circuit, a light source, and an imaging system. The imaging system may comprise a lens, and an aperture stop, wherein the light source outputs a modulated light, and each filtering pixel of the array of filtering pixels is configured to detect a modulated light.

In some embodiments, the array of filtering pixels comprises one or more derivative pixels, the filter circuit comprising a first differentiator configured to output a signal proportional to a change in intensity of light falling on the photodiode.

In some embodiments, the first differentiator may comprise a capacitor, a resistor, and a field-effect transistor. In some embodiments, each derivative pixel may further comprise a reset FET configured to enable setting a voltage of the photodiode equivalent to a drain voltage of the system. In some embodiments, each derivative pixel further comprises a buffer electrically disposed between the photodiode and the derivative sensing circuit.

In some embodiments, the buffer may comprise a buffer FET, and a preliminary differentiator configured to output a signal proportional to an intensity of light falling on the photodiode. In some embodiments, each derivative pixel further comprises a second differentiator configured to output a signal proportional to a change in the change in intensity of light falling on the photodiode, the second differentiator electrically disposed after the first differentiator.

In some embodiments, the array of filtering pixels comprises one or more light source filtering pixels, the filter circuit comprising a sample-and-hold filter and a subtractor. The sample-and-hold filter may comprise a sample FET and a capacitor, wherein the sample FET is configured to sample an output from the photodiode in accordance with the detected modulated light, and the capacitor stores the sample of the output from the photodiode. The filter circuit may further comprise a current mirror.

In some embodiments, the current mirror outputs a current proportional to a magnitude of a difference between a voltage of the sample of the output from the photodiode and a voltage of the output of the photodiode. In some embodiments, a high polarity of the filtering pixel is aligned with an ON state of the modulated light during a frame. In some embodiments, a high polarity of the filtering pixel is aligned with an ON state of the modulated light for a first half of a frame, and aligned with an OFF state of the modulated light for a second half of the frame. In some embodiments, the high polarity of the filtering pixel is modulated asynchronously with the modulated light of the light source.

In some embodiments, the filter circuit comprises two sample-and-hold filters, wherein a first sample and hold filter stores a first sample of the output of the photodiode in a first capacitor and a second sample and hold filter stores a second sample of the output of the photodiode in a second capacitor. In some embodiments, the filter circuit further comprises a current mirror.

In some embodiments, the current mirror outputs a current proportional to the magnitude of a difference between a voltage of the first sample and a voltage of the second sample. In some embodiments, the filter circuit comprises a plurality of sample and hold filters.

In some embodiments, the system may further comprise a coherent detection component, comprising a laser diode and a prism configured as a band pass filter corresponding to a wavelength of light emitted by the laser diode.

In some embodiments, the laser diode and the light source are the same.

In some embodiments, the system may further comprise an integrator circuit at an output of the filter circuit. In some embodiments, the integrator comprises a FET and a capacitor.

In some embodiments, the filtering circuit is modulated synchronously with a modulation scheme applied to the light source. In some embodiments, the filtering circuit is modulated asynchronously with a modulation scheme applied to the light source.

In accordance with one embodiment, a method of programming a filtering pixel comprises determining a type of filtering to be performed on a signal outputted from a photodiode of the filtering pixel, and setting one or more FETs to a particular state based on the determined type of filtering. The type of filtering may include one of: no filtering; derivative filtering; or sample and hold filtering. In some embodiments, the type of filtering further comprises: double derivative filtering; multiple derivative filtering; double sample and hold filtering; or multiple sample and hold filtering.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 25A illustrates when the filtering pixel is configured to determine when an object is illuminated and remove unwanted light sources.

FIG. 25B illustrates when the filtering pixel is configured to determine when an object is moving.

FIG. 26 illustrates an example imaging system in accordance with various embodiments of the technology disclosed herein.

FIG. 27 illustrates an example pixel array in accordance with embodiments of the technology disclosed herein.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Figure 20:
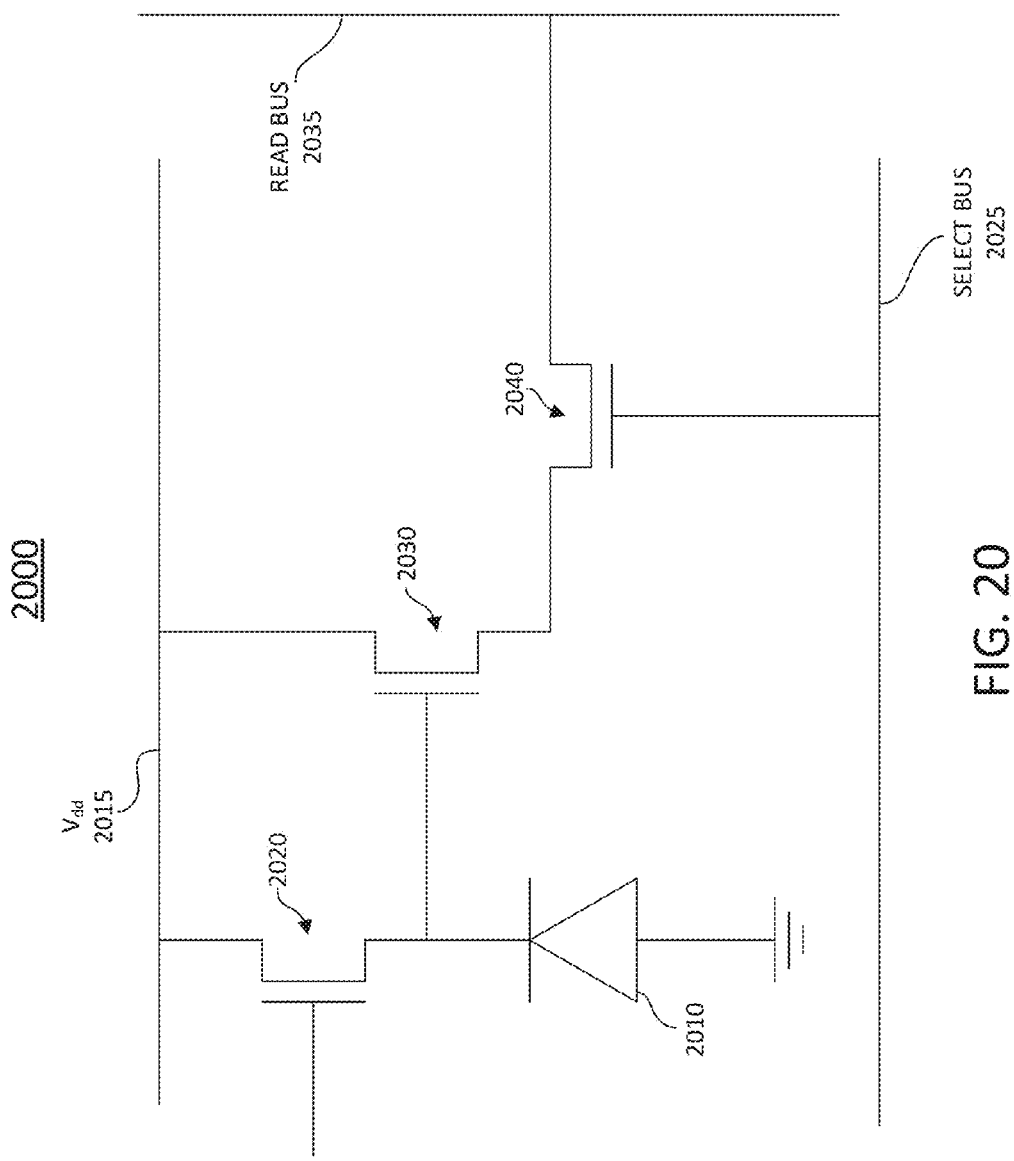
FIG. 20 illustrates an example traditional pixel used in current image sensors.

A traditional pixel utilized in image sensors simply outputs the total intensity of all light falling on the photodetector. FIG. 20 is an illustration of a basic pixel 2000 implemented in image sensor products, such as digital cameras. The pixel 2000 includes a photodiode 2010 for converting absorbed light into an electric current. The photodiode 2010 may be a p-n junction, while other embodiments may utilize a PIN junction (a diode with an undoped intrinsic semiconductor region disposed between the p-type semiconductor region and the n-type semiconductor region). As light falls on the photodiode 2010, the photodiode 2010 bleeds charge to ground, pulling the output voltage of the photodiode 2010 closer to ground. The output voltage of the photodiode 2010 is an integral of the light intensity on the photodiode 2010. Field-effect transistor (FET) 2030, controlled by the drain voltage $V_{dd}$ 2015, serves a buffer amplifier to isolate the photodetector 2010. The output from the FET 2030 is proportional to the integral of the intensity of light on the photodiode 2010. The select FET 2040 is controlled by the select bus 2025 allows for the output from the pixel to be outputted to the read bus 2035. A reset FET 2020 is placed between the photodiode 2010 and the drain voltage $V_{dd}$ 2015. The reset FET 2020, when activated, serves to make the output voltage of the photodiode 2010 equivalent to $V_{dd}$ 2015, thereby clearing any stored charge.

As arranged, each pixel outputs a signal proportional to the integral of the intensity of all the light falling on the photodiode 2010. That is, the total intensity of the light falling on the photodiode 2010 is outputted when the select FET 2040 is selected. That output can be modified through pre- or post-filtering applied to the image sensor. For example, in order to limit the type of light captured by the pixel (i.e., desired wavelengths), optical filters are generally added to the image sensor over the pixels. In CMOS applications, optical filters generally comprise layers of resist or other material placed above the photodiode of the pixel, designed to pass only one or more particular wavelengths of light. In some applications, a purpose-built lens or microlens array may also be used to filter the type or amount of light that reaches each pixel. Such optical filters, however, are not perfect, allowing some stray, undesired light to pass through. Moreover, optical filters may be overpowered by high-intensity light sources hindering the effectiveness of the filter. Accordingly, the output intensity of each pixel includes such undesired intensity.

Additionally, digital filtering may be applied to the output from each pixel to filter out certain aspects of the captured light. Traditional digital filtering is used to perform complex processing of the captured light, including sampling and application of complex algorithms to identify specific components of the captured light. Before any digital filtering may occur, however, the analog signal from the pixel must be converted into a digital signal, requiring the use of A/D converters. This need to convert the signal into the digital domain limits the speed at which processing may occur. As a result, information in the light that is faster than the frame rate of the sensor is lost. Moreover, the digitized signal includes all of the raw intensity captured by the pixel, meaning that if undesired information was captured it is embedded within the digital signal, limiting the effectiveness of filtering techniques meant to account for various problems in imaging (e.g., motion blur).

Accordingly, image sensors are, in essence, broken into three different domains: the optical domain, the pixel (analog) domain, and the digital processing domain. Variations of filtering have been applied in the optical domain and the digital processing domain, designed to filter out or enhance particular aspects of the captured image signal. However, the pixel domain has generally been limited to traditional pixels comprising merely a photodetector, or a photodetector and an amplifier in the case of active pixel sensors. That is, there is no additional filtering conducted in the pixel domain that could assist in overcoming deficiencies in the optical filtering or to ensure that only desired image signals are captured and outputted.

To this end, embodiments of the technology disclosed herein provides filtering-pixels for use in image sensors. The filtering-pixels of the embodiments disclosed herein provide additional filtering capabilities to image sensors, as opposed to the non-filtering characteristics of traditional pixels. The capabilities of filtering-pixels in accordance with embodiments of the technology disclosed herein provide an analog filter within the pixel domain, providing for more efficient filtering and processing of captured light. By adding filtering functionality to the pixels themselves, various embodiments of the technology allow for greater differentiation between light sources, enabling more efficient and finer filtering of undesired light sources, reducing saturation caused by high-intensity light and providing clearer image resolution. Further, greater separation between objects within a scene is possible by filtering out relevant aspects of the captured light (e.g., derivatives of the intensity) at the pixel level. That is, filtering pixels in accordance with embodiments of the disclosure herein remove undesired aspects of a captured image such that only the desired information signals are outputted at greater frame rates.

Moreover, various embodiments disclosed herein provide image sensors having a plurality of filtering pixels, enabling different information within an image to be captured simultaneously, and the plurality of filtering pixels may be programmable. Moreover, embodiments of the technology disclosed herein provide a hybrid analog-digital filter, enabling faster filtering of image signals by removing the need for an A/D converter. Moreover, various embodiments of the technology disclosed herein provide image sensors, cameras employing different embodiments of the image sensors, and uses thereof to provide cameras that are computationally less intensive and faster than traditional cameras through the use of filtering pixels.

Figure 21:
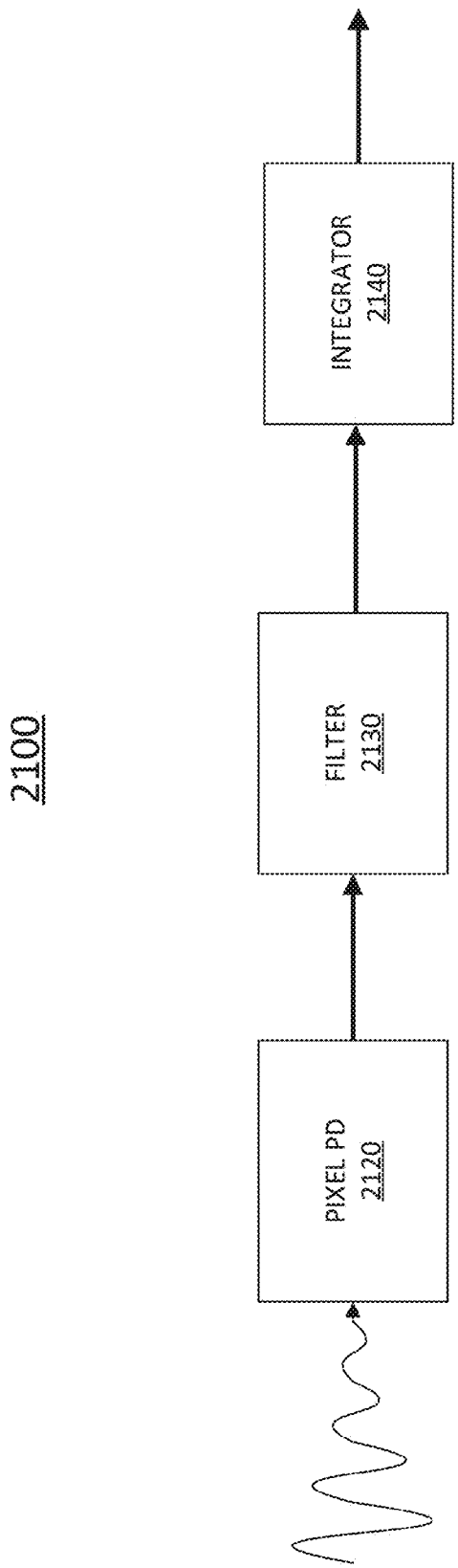
FIG. 21 is a block diagram illustrating the general approach for a filtering pixel in accordance with various embodiments of the technology disclosed herein.

FIG. 21 is a block diagram illustrating the general approach for a filtering pixel 2100 in accordance with various embodiments of the technology disclosed herein. As illustrated, the photodiode 2120 of the filtering pixel 2100 absorbs photons from light, outputting a current proportional to the intensity of the light (like a traditional pixel). A filter 2130 is embedded in the filtering pixel 2100. As will be explained in greater detail below, the filter 2130 may be configured to perform one of several different filtering functions. For example, the filter 2130 may filter to pass one or more derivatives of the output signal from the photodiode 2120. In other embodiments, the filter 2130 may perform a pseudo-digital sampling of the analog signal, adding and subtracting these samples to filter out particular aspects of the output signal from the photodiode 2120. The integrator 2140 outputs an integrated version of the signal output from the filter 2130. The output of the integrator 2140 would be digitized by an analog to digital converter.

Although described with respect to integrating within the current domain, a person of ordinary skill in the art would understand that the filtering approach described with respect to FIG. 21 may be done in the voltage domain. That is, instead of performing the filtering on a current signal, the output from the photodiode 2120 could be converted into a voltage and the filtering applied to the voltage. In other embodiments, portions of the filtering may be applied to a current signal while others are applied after the current signal is converted into a voltage signal. A person of ordinary skill in the art would understand how to modify the circuitry of the filtering pixel 2100 in enable filtering to occur in the current or voltage domains.

As alluded to above, filtering pixels in accordance with embodiments of the technology disclosed herein can be equipped with a variety of filtering capabilities. This enables a range of various signal aspects to be outputted by the filtering pixel, increasing the type of information about the scene that can be identified with higher resolution. For example, in various embodiments, the filtering pixels may filter to pass aspects of the signal indicative of motion within a captured scene. The conventional frame subtraction technique for measuring the displacement of objects, which can be interpreted as movement, within the FOV of a camera suffers from several disadvantages. One such disadvantage is a low update rate. For example, if two frames are subtracted to determine the motion of an object, displaying the resulting image requires the time needed to capture two frames and the computation time required to subtract the two frames. In addition, since each frame is an integral of the intensity for every pixel during the exposure time, changes that take place during each frame time are missed. Moreover, the frame subtraction technique is sensitive to blur effects on images, caused either by other objects within the camera's FOV or the motion of the camera itself. Changes in illumination also impact the ability to rely on frame subtraction, as it is more difficult to distinguish motion where the light reflecting off of or through objects varies independent of the motion of the objects. In summary, traditional cameras and image sensors are designed to capture non-moving images. As soon as there is motion or change in the scene, image quality is compromised and information is lost. Cameras and image sensors implementing embodiments of the technology disclosed herein provide advantages over traditional cameras and image sensors for a variety of different applications. Background separation is easier as only motion is captured through the use of derivative sensing. Conventional cameras capture all objects within a frame. This makes it more difficult to separate out moving objects from stationary objects in the background. For security applications, by limiting the amount of information captured it is easier to identify objects of interest within a scene.

Further, frame subtraction is computationally intensive. Conventional image sensors in cameras generally capture all objects within the FOV of the camera, whether or not the object is moving. This increases the amount of data for processing, makes background separation more difficult, and requires greater processing to identify and measure motion within the FOV. This renders motion detection through frame subtraction computationally intensive.

By utilizing a filtering pixel configured to filter one or more derivatives of the light intensity in accordance with embodiments of the technology disclosed herein, less computationally intensive and faster motion detection is provided compared with cameras employing traditional pixels. Traditional image sensors integrate the light that falls on each pixel and outputs how much light fell on that pixel during the frame. In contrast, image sensors in accordance with various embodiments described herein can detect changes in the light falling on pixels of the image sensor during the frame. In particular, the image sensors described herein detect the change in the intensity of light detected on the photodiodes of the pixels comprising image sensors, rather than detecting mere intensity on that photodiode (as in traditional image sensors). Where the intensity is constant (i.e., no movement), no voltage is accumulated. However, if the intensity of the light is varying (i.e., there is movement within the FOV), the output will be proportional to the number and size of changes during the frame. The more changes, or the larger the change, the larger the output voltage. In some embodiments, this type of image sensor employing derivative sensing may be implemented within a conventional camera to directly detect movement in addition to capturing the entire scene.

Figure 16A:
FIG. 16A illustrates a first frame from a conventional camera in a security application.
Figure 16B:
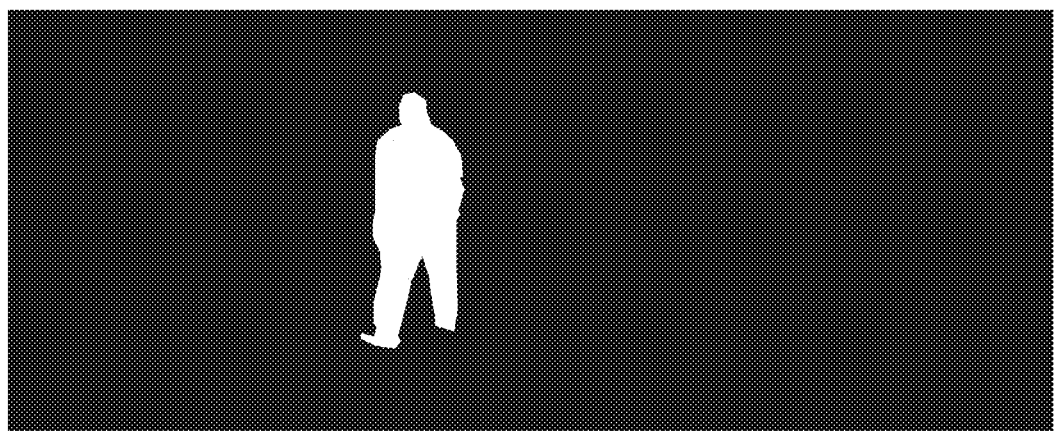
FIG. 16B illustrates the first frame from a camera in accordance with embodiments of the technology described herein.

For example, FIG. 16A illustrates a frame captured using a conventional camera in a security application. As illustrated, all objects within the FOV of the camera are captured, including the ground, the car, and an individual that is walking. By capturing each of these objects, a large amount of information is obtained and stored when all that is of interest may be the movements of the individual in the scene. In contrast, FIG. 16B illustrates a frame captured by a camera implementing embodiments of the technology described herein. As can be seen in FIG. 16B, only the man (who is walking to the bottom left corner of the frame) is captured. By not capturing all the elements in the background, identification of a moving object is made easier.

In some embodiments, the camera in FIG. 16B may capture not only motion within the frame, but also capture and provide quantitative information on the motion (e.g., the velocity of the moving object; acceleration of the object; direction of motion; etc.). This information may be conveyed in a number of different ways. Some non-limiting examples may include: different colors indicating different velocities or ranges of velocities; textual layovers; graphical indications; or a combination thereof. Post-processing may be utilized to augment the derivative sensed images captured by the camera. Because the information is directly sensed through the derivative sensing capability of embodiments of the technology disclosed, post-processing of the frame is less computational intensive than is required to obtain the same information using traditional cameras. In some embodiments, the quantitative image for each derivative pixel is used as the input of a control system. For example, in some applications, faster moving objects may be more important. In some embodiments, the derivative pixel image may be further processed or filtered to eliminate noise or false images.

Figure 17A:
FIG. 17A illustrates a second frame from a conventional camera in a security application.
Figure 17B:
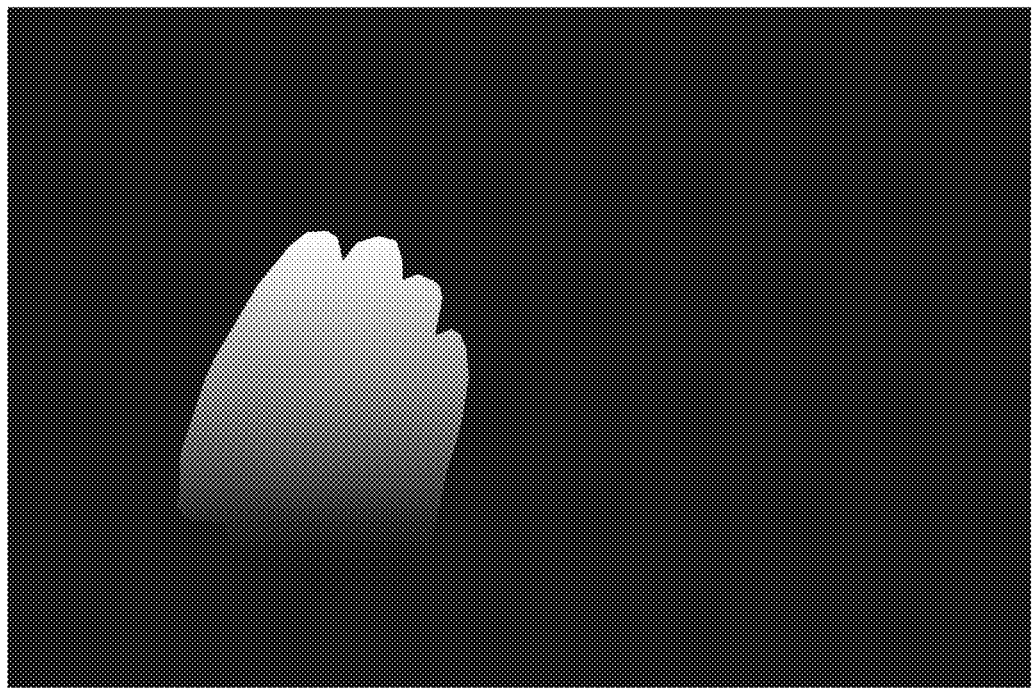
FIG. 17B illustrates the second frame as captured by a camera in accordance with embodiments of the technology disclosed herein

Implementations of embodiments of the technology disclosed herein may also provide benefits for other applications, such as gesture recognition, obstacle avoidance, and target tracking, to name a few. FIG. 17A shows a frame captured with a conventional camera, where an individual is making a "come here" gesture, as if calling a dog. Similar to the camera in FIG. 16A, all of the elements in the background of the scene including the object of interest (in this case, the gesturing individual) are captured by the camera of FIG. 17A, making background separation difficult. Moreover, the gesture being made is moving away from the camera, which makes identification of the gesture more difficult because the motion is perpendicular to the image sensor. This is especially true for slight motions away from the camera, which may not be visibly noticeable. FIG. 17B illustrates the same frame as captured by a camera implementing embodiments of the technology disclosed herein. As illustrated in FIG. 17B, only the gesture is captured by the camera. Moreover, the captured image illustrates a gradient representation, whereby the portion of the gesture with which greater is motion associated (the upper portions of the fingers) is represented by a more pronounced shade of white. This is because, as the fingertips move more than the knuckles, more charge is accumulated within the derivative sensing circuit (as will be discussed in greater detail below).

Such implementations also make it easier to identify and detect low energy motions. Conventional cameras and time of flight cameras that capture the entire scene require large motions that are easily distinguishable from the background in order to identify gestures or moving objects. By implementing embodiments of the technology disclosed herein, it is possible to capture low energy motion more easily, allowing for greater motion detection and identification. Even slight motions, like a tapping finger, can be picked up (which could otherwise be missed using traditional image sensors).

Figure 1:
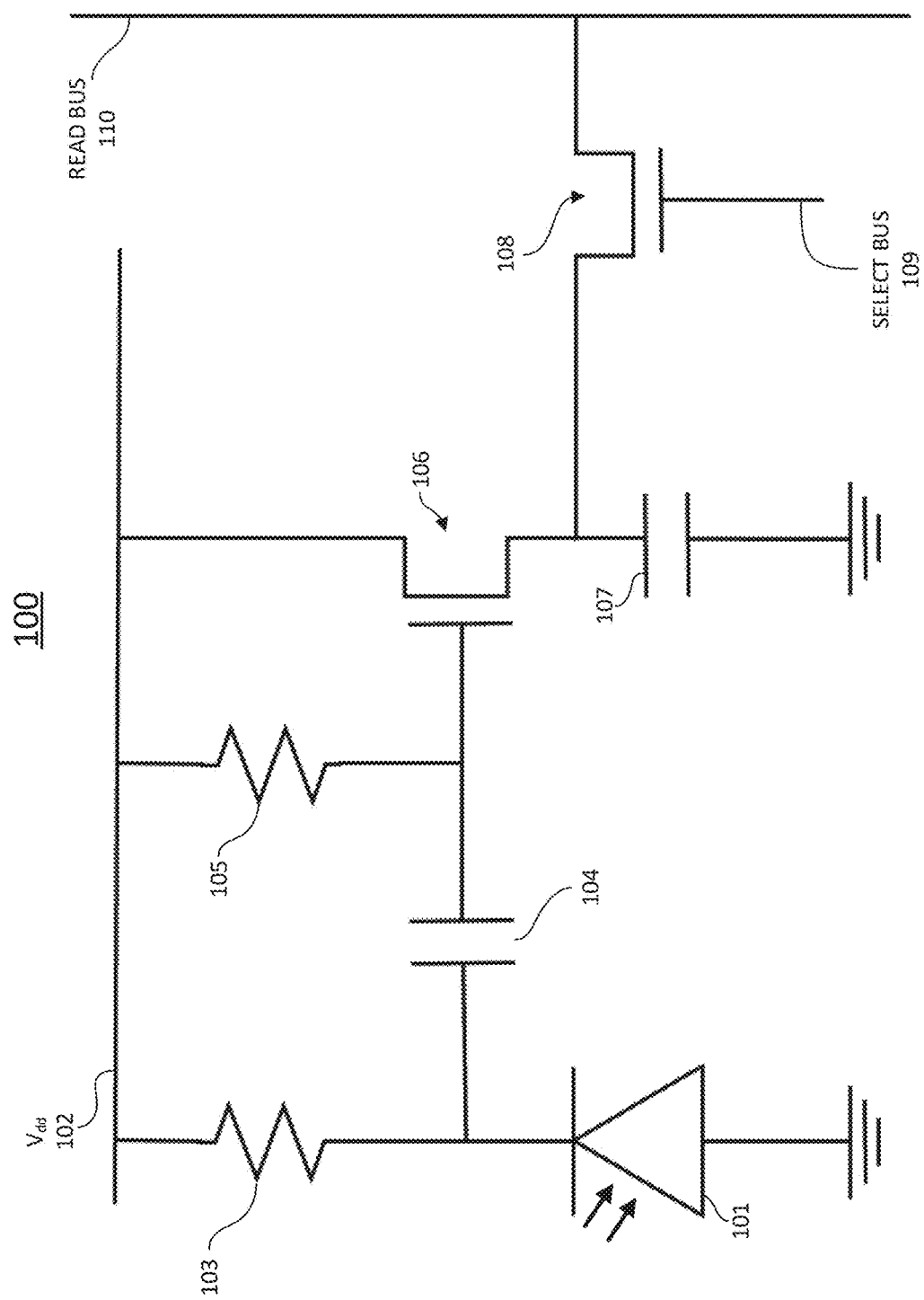
FIG. 1 is a circuit diagram of an example derivative pixel in accordance with embodiments of the technology disclosed herein.

Various embodiments of the technology disclosed herein utilize derivative filtering to directly detect and capture motion within the scene. FIG. 1 is a circuit diagram of an example filtering pixel 100 configured to filter out the derivative of the intensity of light, in accordance with embodiments of the technology disclosed herein. In the illustrated example, the filtering pixel 100 is a complementary metal-oxide-semiconductor (CMOS), which captures images by scanning across rows of pixels, each with its own additional processing circuitry that enables high parallelism in image capture. The example filtering pixel 100 may be implemented in place of traditional pixels in an active-pixel sensor (APS) for use in a wide range of imaging applications, including cameras. As illustrated in FIG. 1, the filtering pixel 100 includes a photodiode 101. The photodiode 101 operates similarly to the photodiode 2010 discussed above with respect to FIG. 20.

Resistor 103 converts the current generated by the photodiode 101 into a voltage. In some embodiments, the resistor 103, and any other resistors illustrated throughout, may be implemented by using a switched capacitor. Capacitor 104 and resistor 105 act as a high-pass filter. Capacitor 104 serves to filter the alternating current (AC) components of the input voltage (when the intensity of the light on the photodiode 101 varies or changes), allowing an AC current to pass through. A derivative of the input voltage is taken by said capacitor 104 and resistor 105, which serves to connect to the supply and eliminate any DC voltage component. The derivative signal is integrated by the field-effect transistor (FET) 106 and capacitor 107 (i.e., an integrator), to generate the output voltage of the filtering pixel 100. The capacitor 104 and resistor 105 forming the high pass filter and may be referred to as a "differentiator," a type of circuit whose output is approximately directly proportional to the time derivative of the input. A second FET 108 reads out the output voltage when the Select Bus 109 voltage (i.e., gate voltage for second FET 108) is selected to "open" the second FET 108 (i.e., a "conductivity channel" is created or influenced by the voltage).

When the intensity of light falling on the photodiode 101 is constant, there is a constant amount of current flowing through the photodiode 101 and the resistor 103 from the voltage $V_{dd}$ 102 into ground. This creates a constant voltage at the input of the capacitor 104 (and no signal goes through capacitor 104). When the intensity of light falling on the photodiode 101 varies, an AC component of the signal is created that is coupled through the capacitor 104. This AC component of the signal is integrated by the FET 106 and capacitor 107, and the integrated signal is read out on the Read Bus 110 when the row (within an APS) containing the pixel is selected through a proper voltage being applied to the Select Bus 109.

Figure 2:
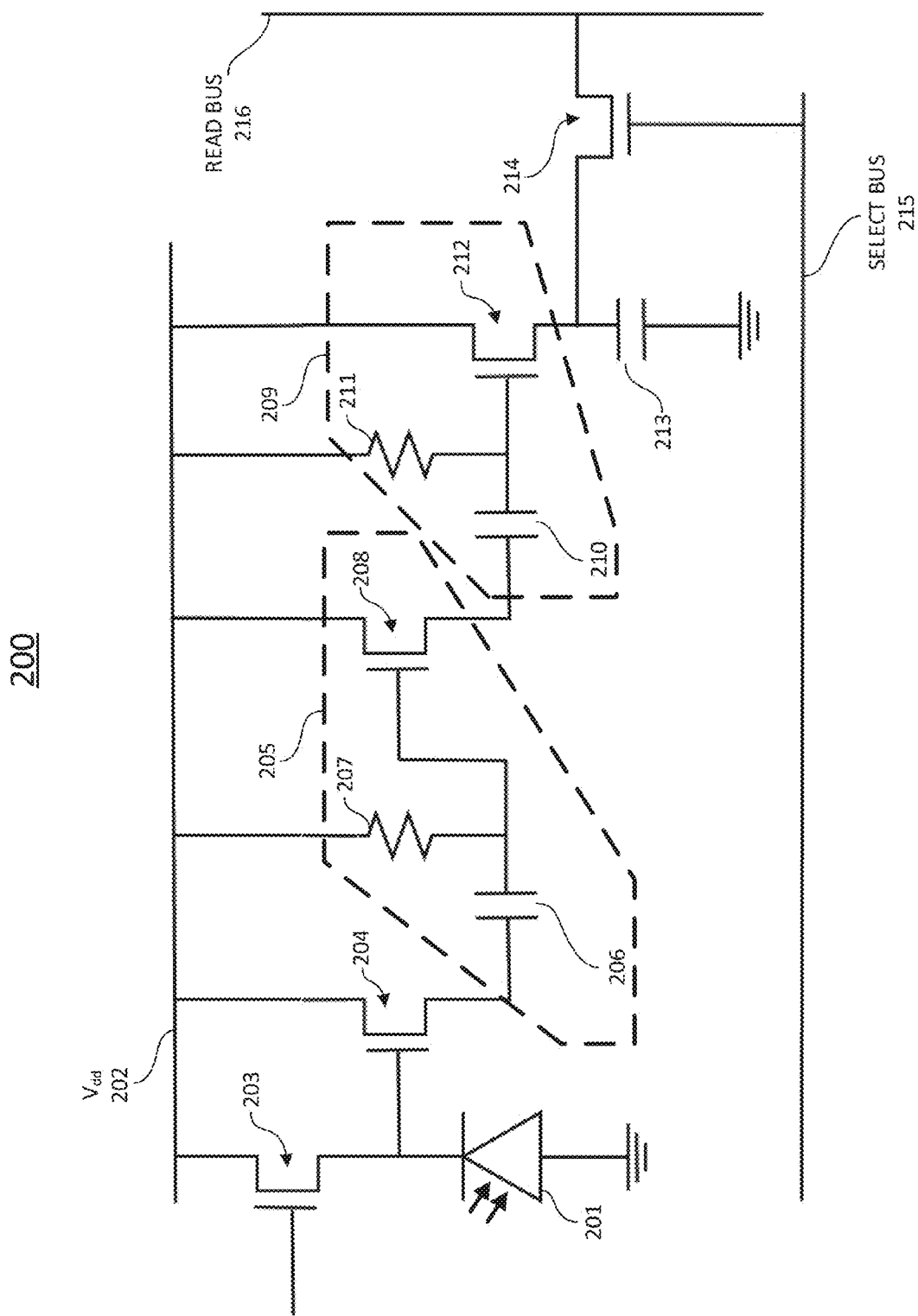
FIG. 2 illustrates another example derivative pixel for accumulating charge in accordance with embodiments of the technology disclosed herein.

In some cases, the amount of light falling on the photodiode may be very small. For such low intensity changes, it may be beneficial to include a charge accumulator and/or buffer before the differentiator. FIG. 2 illustrates another example filtering pixel 200 configured to filter to pass the derivative of the intensity of light in accordance with embodiments of the technology disclosed herein. Similar to the example filtering pixel 100 of FIG. 1, the example filtering pixel 200 may be implemented in place of traditional pixel sensors in an array of an active-pixel sensor (APS) for use in a wide range of imaging applications, including cameras. In various embodiments, the photodiode 201 may use a p-n junction, while other embodiments may utilize a PIN junction (a diode with an undoped intrinsic semiconductor region disposed between the p-type semiconductor region and the n-type semiconductor region). As light falls on the photodiode 201, the photodiode 201 bleeds charge to ground, pulling the output voltage of the photodiode 201 closer to ground. The output voltage of the photodiode 201 is an integral of the light intensity on the photodiode 201. A reset FET 203 is placed between the photodiode 201 and the drain voltage $V_{dd}$ 202. The reset FET 203, when activated, serves to make the output voltage of the photodiode 201 equivalent to $V_{dd}$ 202, thereby clearing any stored charge. In various embodiments, a pixel reset voltage (not pictured) may be utilized as the gate voltage of the reset FET 203. This can be utilized in between frames, so that minimal residual charge carries over from frame to frame. In some embodiments, a controlled leakage path to $V_{dd}$ may be used to counteract the charge accumulation, as was done by resistor 103 in the embodiment described in FIG. 1. In some embodiments, this controlled leakage is provided by pulsing or otherwise controlling the leakage through FET 203.

In various embodiments, a buffer FET 204 may be included. When the amount of light falling on the photodiode 201 varies, the buffer FET 204 enables reading out of the output voltage of the photodiode 201 (which will accumulate with changes in the amount of light) without taking away the accumulated charge. As illustrated, the gate voltage of the buffer FET 204 is the voltage from the photodiode 201, and both the buffer FET 204 and the photodiode 201 have a common drain (in this case, $V_{dd}$ 202). The output voltage of the buffer FET 204 is proportional to the integral of the intensity of light on the photodiode 201. The buffer FET 204 also serves to isolate the photodiode 201 from the rest of the electronic circuits in the pixel.

In various embodiments, a first differentiator 205 takes a derivative of the output voltage of the buffer FET 204. The first differentiator 205 includes capacitor 206, resistor 207, and FET 208. The output voltage of the first differentiator 205 is proportional to the instantaneous intensity on the photodiode 201.

To identify motion within the FOV of the filtering pixel 200 (and to reverse the integration of the accumulator (e.g., FET 204)) the change in intensity of the photodiode is determined. A second differentiator 209 takes the derivative of the output voltage of the first differentiator 205. The output voltage of the second differentiator 209 is proportional to the change in intensity on the photodiode 201. The capacitor 213 integrates the output voltage of the second differentiator 209. When the Select Bus 215 is set to open the FET 214, the integrated output voltage is read out on the Read Bus 216.

Figure 3:
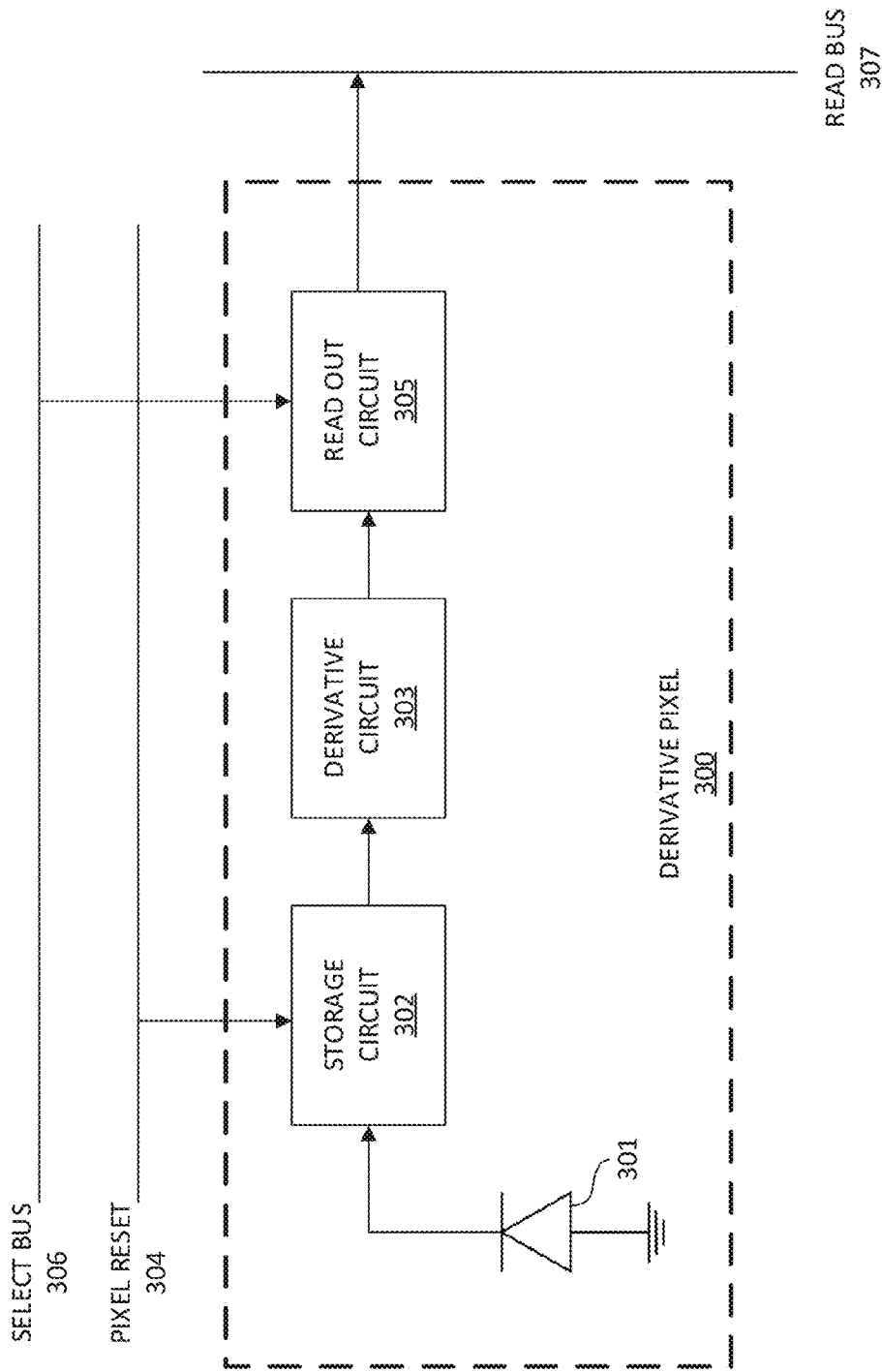
FIG. 3 is a block diagram illustration of an example derivative pixel in accordance with embodiments of the technology disclosed herein.

FIG. 3 is a block diagram illustrating an example filtering pixel 300 in accordance with embodiments of the technology disclosed herein. The filtering pixel 300 may be one embodiment of the filtering pixel 200 discussed with respect to FIG. 2. As illustrated in FIG. 3, the filtering pixel 300 includes a photodiode 301. The photodiode 301 is connected to a storage circuit 302 for storing the charge from the photodiode 301 and converting to a voltage. As illustrated in FIG. 1, the storage circuit is optional in some embodiments and the signal from the photodiode may go directly to the derivative circuit. In some embodiments, the storage circuit 302 may include a buffer FET, similar to the buffer FET 204 discussed with respect to FIG. 2. Various embodiments may also include a reset FET for clearing any stored charge in between frames (utilizing the pixel reset voltage 304 to control the gate of the reset FET), similar to the reset FET 203 and discussed with respect to FIG. 2.

The output of the storage circuit 302 goes through the derivative circuit 303. In various embodiments, the derivative circuit 303 may be similar to the first and second differentiators 205, 209 discussed with respect to FIG. 2. The derivative circuit 303 outputs an output voltage proportional to the change in intensity on the photodiode 301.

The output of the derivative circuit 303 is integrated and read out through the read out circuit 305 when the select bus 306 voltage is set to activate the read out circuit 305. The read out circuit 305 may be similar to the capacitor 213 and FET 214, discussed with respect to FIG. 2. The output of the read out circuit 305 is the number and size of changes in intensity on the photodiode 301 during the frame, and is read out on the read bus 307.

Figure 4:
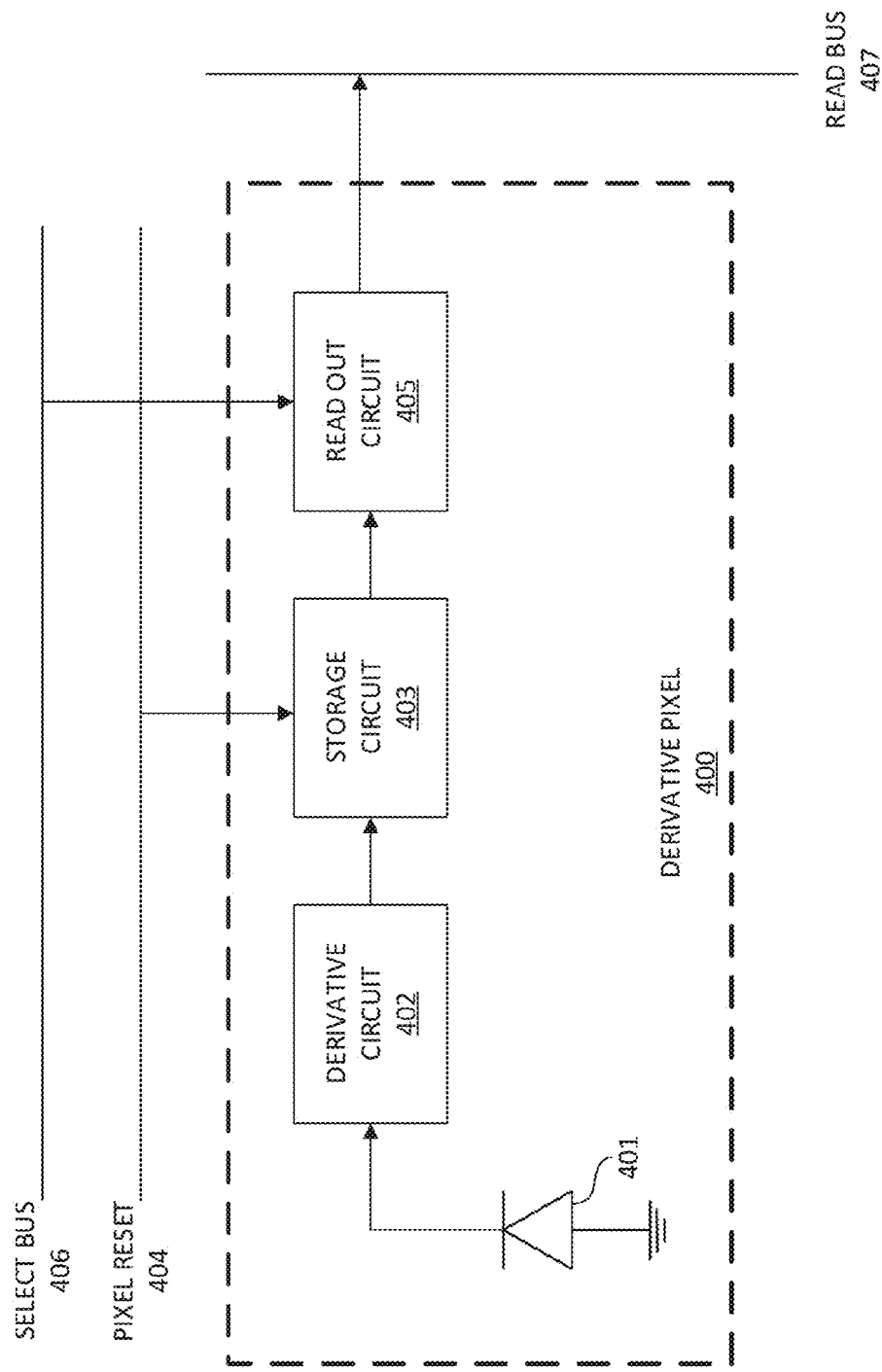
FIG. 4 is a block diagram illustration of another example derivative pixel in accordance with embodiments of the technology disclosed herein.

In some embodiments, the derivative circuit may be placed before the storage circuit, thereby enabling storage of changes during the frame so they may be stored and read out using standard select bus and read bus architecture. FIG. 4 illustrates an example of such a filtering pixel 400 in accordance with embodiments of the technology disclosed herein. The components of the filtering pixel 400 are similar to those discussed with respect to FIG. 3, except that the derivative circuit 402 is placed in front of the storage circuit 403.

Figure 5A:
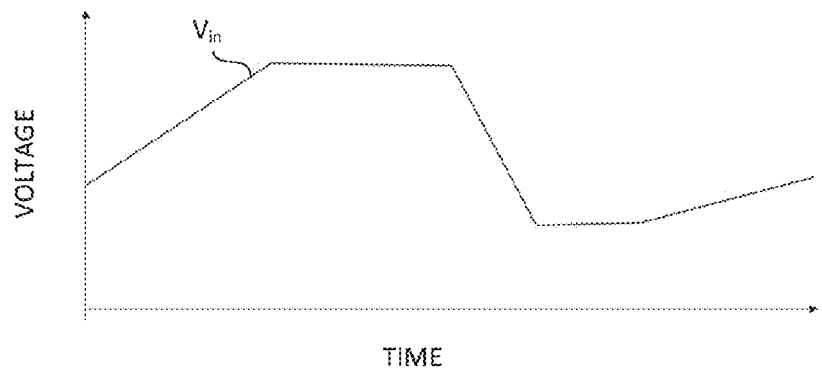
FIGS. 5A, 5B, and 5C illustrate the outputs of different parts of an example derivative pixel in accordance with embodiments of the technology of the present disclosure.
Figure 5B:
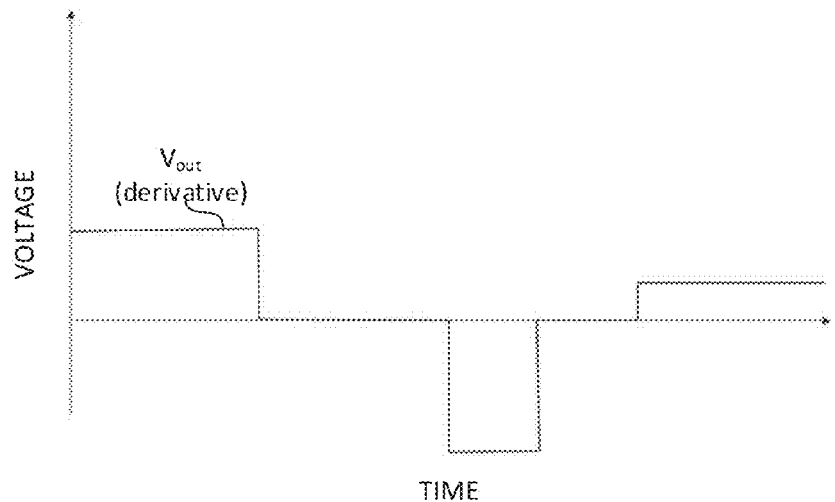
Figure 5C:
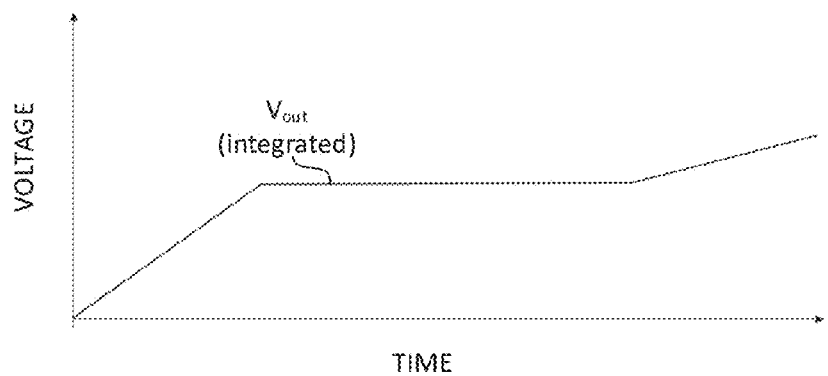

FIGS. 5A, 5B, and 5C illustrate the output of a filtering pixel described according to FIG. 1. FIG. 5A illustrates the input voltage $V_{in}$, which is proportional to the intensity of the light falling on the photodiode, as a function of time. FIG. 5B illustrates the output voltage of the derivative circuit $V_{out}$ (derivative). FIG. 5C illustrates the corresponding integrated output voltage $V_{out}$ (integrated) through the derivative pixel as a function of time. It can be appreciated that as $V_{in}$ fluctuates, the output of the derivative circuit (FIG. 5B) changes in steps corresponding to the rate of change in the input voltage. In bipolar circuits, the output voltage of the derivative can be negative in some cases (when the input voltage drops). In some embodiments, a unipolar CMOS circuit may be used, which would peg the output voltage of the derivative at zero (eliminating the negative voltage portion of FIG. 5B). As illustrated in FIG. 5C, the integrated output voltage accumulates as the input voltage changes. In some embodiments, the circuit is designed so that the positive derivative is eliminated and the negative derivative is stored. For example, the FET 106 may be replaced by a circuit that inverts the signal. In some embodiments, one portion of the circuit outputs the stored positive derivative and another portion of the circuit outputs the stored negative derivative.

APSs and other imaging sensors implementing filtering pixels in accordance with the embodiments discussed with respect to FIGS. 1-4 enable direct measurement of motion within the FOV of the imaging sensor, without the need for frame subtraction. The motion is measured directly, instead of deriving the motion through post processing. This provides a visual representation of movement within the frame. By adding another derivative circuit to the filtering pixel, not only can the change in intensity of the light be measured, but also the change in the change of intensity of light may be measured. That is, the single derivative circuit (as that described with respect to FIGS. 1-4) senses velocity in the image, while the double derivative circuit senses acceleration within the image. By including an additional derivative circuit to create a double derivative circuit in the filtering pixel, the quality of the motion within the frame may be measured directly, as well as the motion itself, without the need for frame subtraction or other techniques. In some embodiments, even higher order derivatives are taken to measure jerk, snap, etc.

Figure 6:
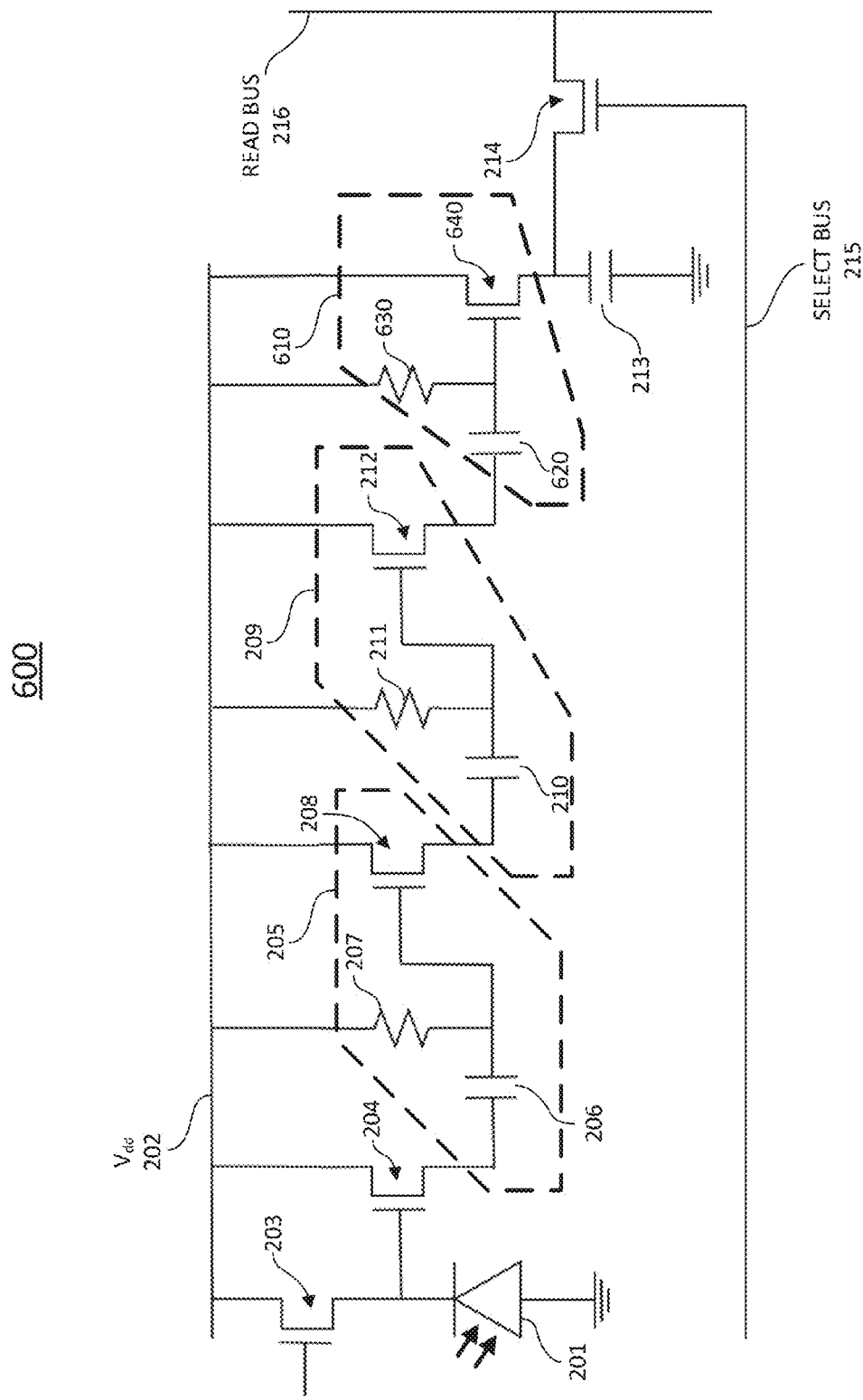
FIG. 6 illustrates an example double derivative pixel in accordance with embodiments of the technology disclosed herein.

FIG. 6 illustrates an example filtering pixel 600 with a double derivative circuit in accordance with embodiments of the technology disclosed herein. The filtering pixel 600 includes the same components as the filtering pixel 200 discussed with respect to FIG. 2. For ease of discussion, similar components in FIG. 6 are referenced using the same numerals as used in FIG. 2, and should be understood to function in a similar manner as discussed above. Referring to FIG. 6, the filtering pixel 600 adds an additional differentiator 610 to the circuit, which takes the derivative of the derivative resulting from the differentiator 209. The output voltage of the additional differentiator 510 is integrated by capacitor 213 and read out on the read bus 216 by the FET 214. In some embodiments, the output of the differentiator 209 may also be read out as well by connecting a second capacitor and FET after the FET 212, and connecting the new FET to the select bus 215 and a second read bus.

Although described with respect to single and double derivatives, nothing in this disclosure should be interpreted to limit the number of derivative circuits that may be utilized. Additional higher order derivatives (e.g., triple derivative) may be created by adding more differentiators to the filtering pixel. Accordingly, a person of ordinary skill would appreciate that this specification contemplates derivative pixels for higher order derivatives.

Figure 7:
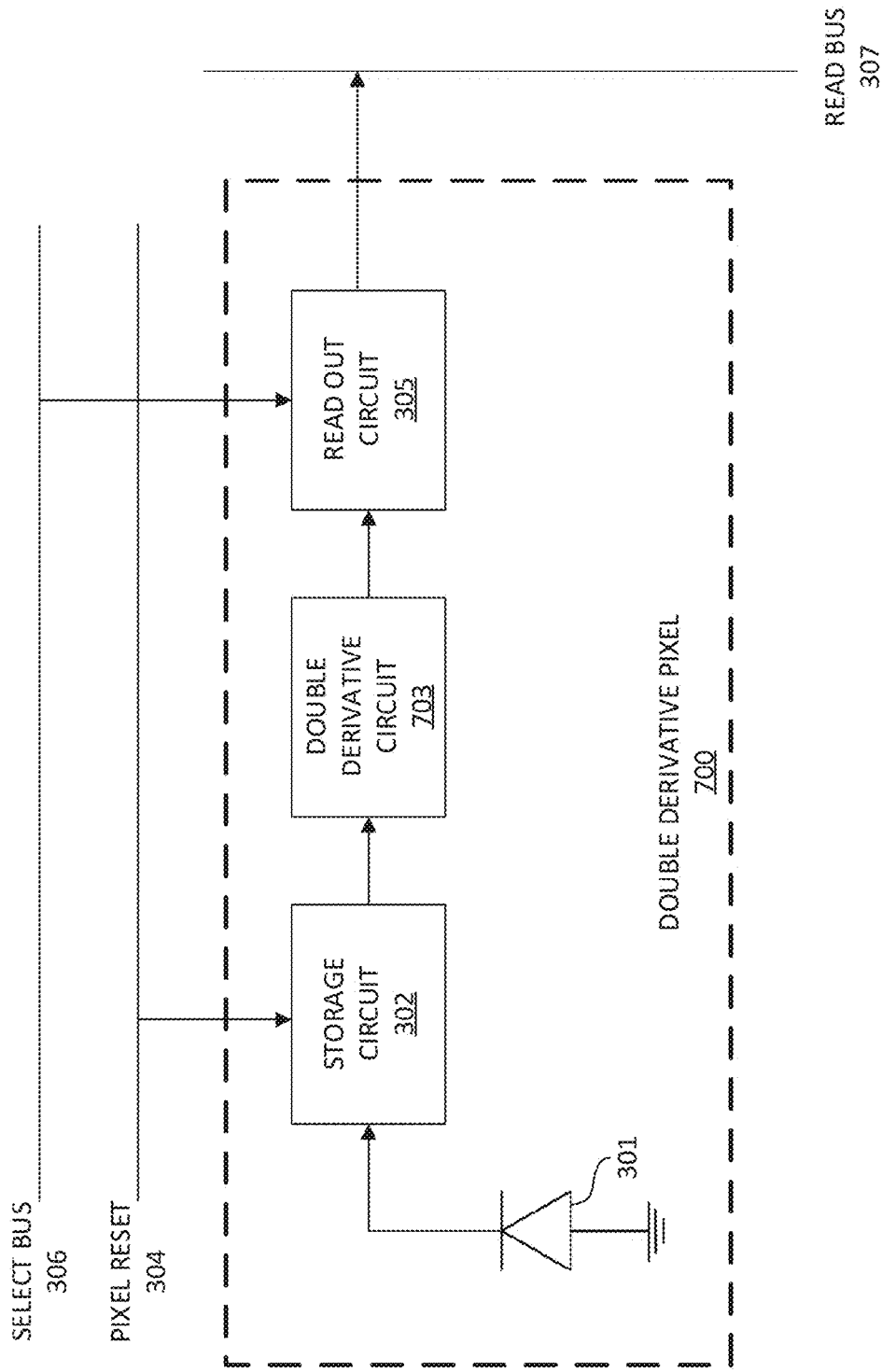
FIG. 7 is a block diagram illustration of an example double derivative pixel in accordance with embodiments of the technology disclosed herein.

FIG. 7 is a block diagram illustration of an example filtering pixel 700 with a double derivative circuit in accordance with embodiments of the technology disclosed herein. The filtering pixel 300 may be similar to the filtering pixel 600 discussed with respect to FIG. 6. For ease of discussion, similar components in FIG. 7 are referenced using the same numerals as used in FIG. 3, and should be understood to function in a similar manner as discussed above. In place of the derivative circuit 303, the filtering pixel 700 includes a double derivative circuit 703. The double derivative circuit 703 may be similar to the first, second, and third differentiators 205, 209, 610 discussed with respect to FIG. 6. The double derivative circuit 703 outputs an output voltage proportional to the change in the change of intensity on the photodiode 301. In some embodiments, the read out circuit 305 may include additional circuitry to read out the output voltage from each differentiator stage in the double derivative circuit 703. In such embodiments, the filtering pixel 700 may include an additional read bus.

Figure 8:
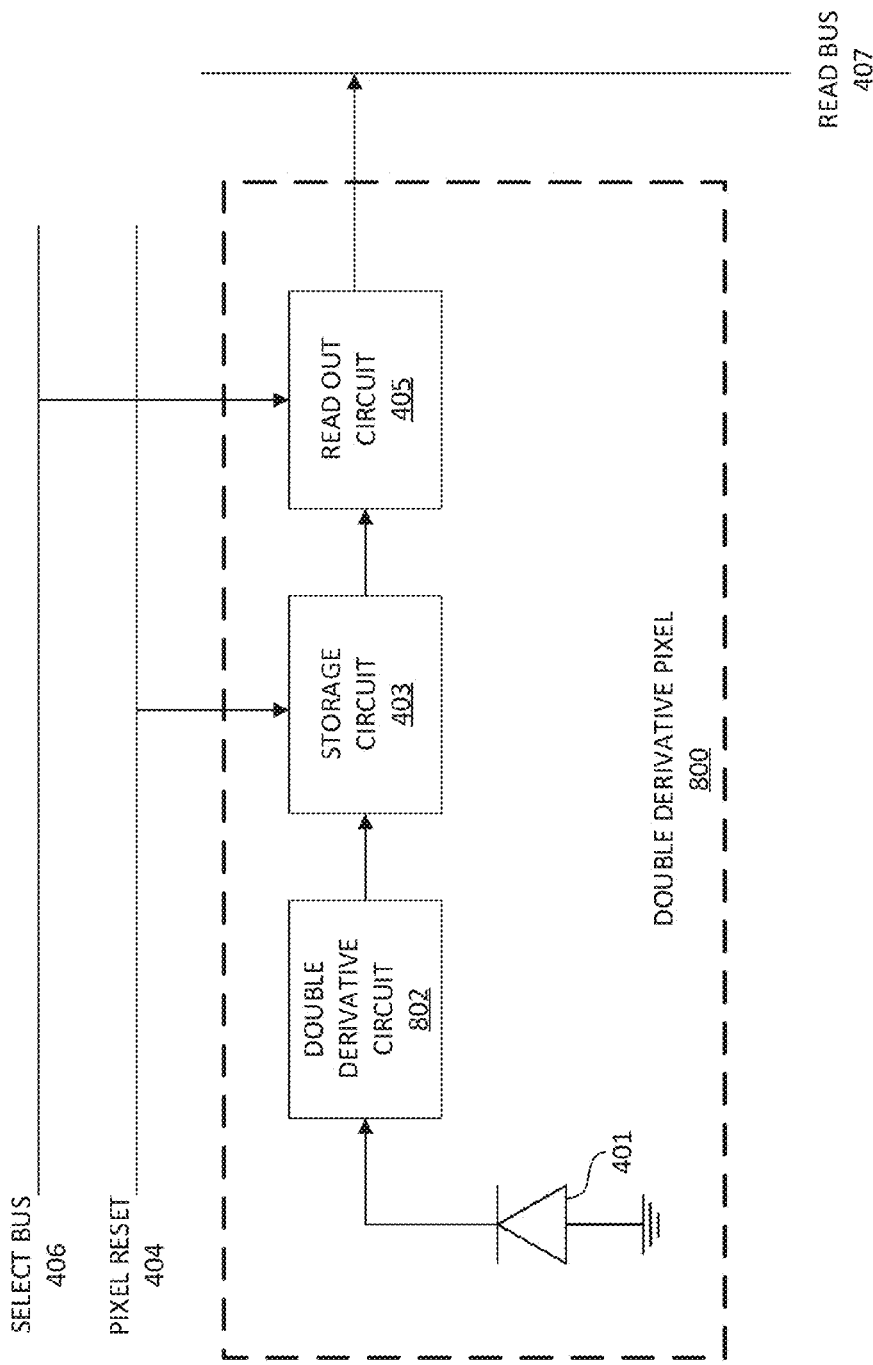
FIG. 8 is a block diagram illustration of another example double derivative pixel in accordance with embodiments of the technology disclosed herein.

In some embodiments, the derivative circuit may be placed before the storage circuit, thereby enabling storage of changes during the frame may be stored and read out using standard select bus and read bus architecture. FIG. 8 illustrates an example of such a filtering pixel 800 in accordance with embodiments of the technology disclosed herein. The components of the filtering pixel 800 are similar to those discussed with respect to FIGS. 4 and 7, except that the double derivative circuit 802 is placed in front of the storage circuit 403. In some embodiments, a single derivative circuit may be placed before the storage circuit and a second derivative circuit placed after the storage circuit. Other variations of the order of derivative and storage circuits exist. There may be multiple derivative circuits and or multiple storage circuits arranged in different orders.

Image sensors (or cameras) containing arrays of filtering pixels similar to the embodiments discussed with respect to FIGS. 1-8 allow for direct measurement of motion within a frame. In essence, such image sensors detect changes in the light falling on each pixel, and the read out of the pixels represent the motion occurring within the frame. This enables motion measurement without the need for intensive processing techniques like frame subtraction.

Figure 9:
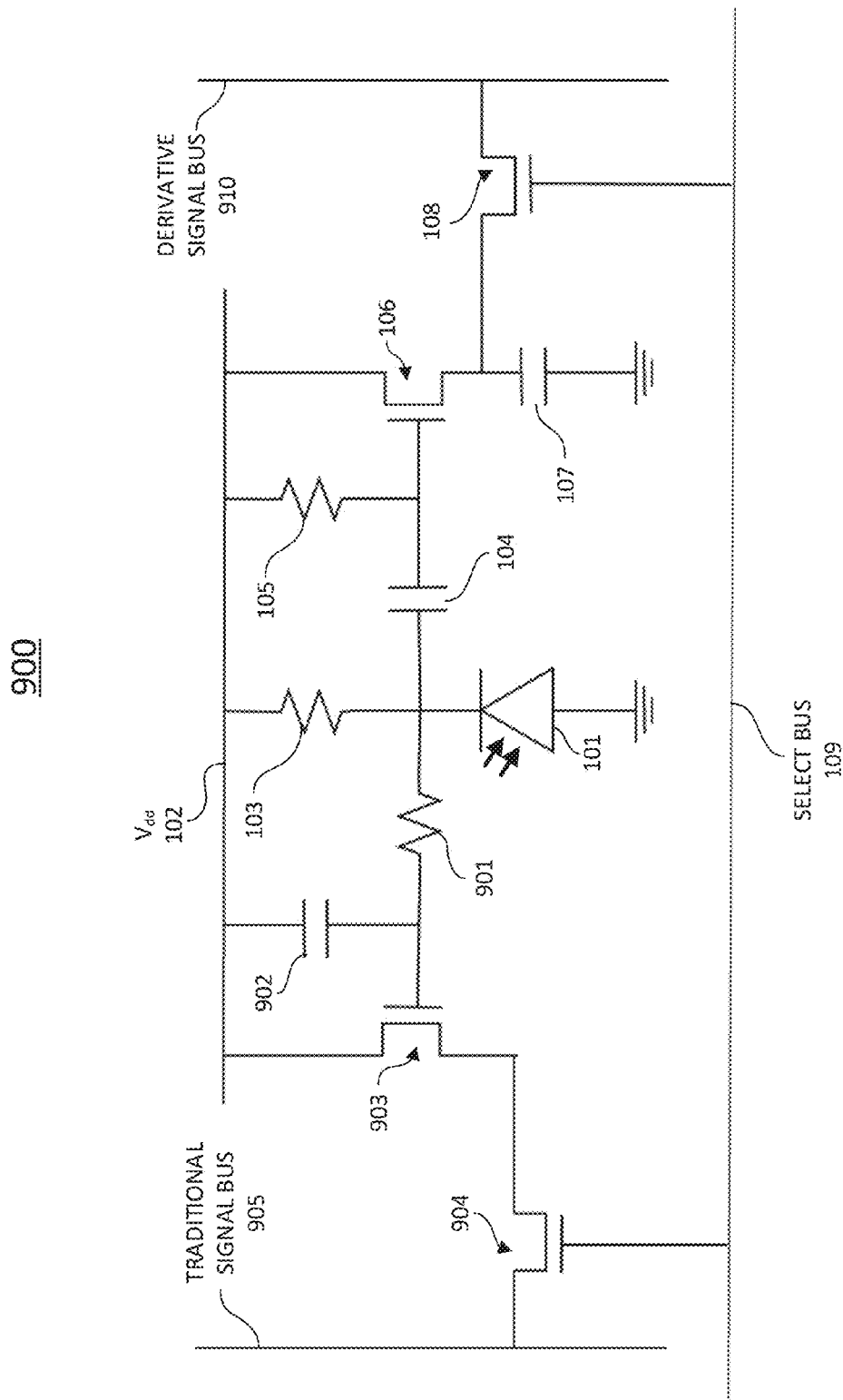
FIG. 9 illustrates an example combined pixel imager in accordance with embodiments of the technology disclosed herein.

In various embodiments, the derivative sensing may be combined with traditional image capturing circuitry. FIG. 9 illustrates an example combined pixel imager 900 in accordance with embodiments of the technology disclosed herein. The example combined pixel imager 900 adds several components to the filtering pixel 100 discussed with respect to FIG. 1. For ease of discussion, similar components in FIG. 9 are referenced using the same numerals as used in FIG. 1, and should be understood to function in a similar manner as discussed above. Referring to FIG. 9, in addition to the filtering pixel components, resistor 901 and capacitor 902 serve as an low pass filter of the current from the photodiode 101 to capture the total amount of light falling on the photodiode during the frame. In various embodiments, FET 903 serves as a buffer to enable reading the integrated signal from the capacitor 902 and resistor 901. When the signal is read out on the traditional signal bus 905 by activating the FET 904 with the select bus 109 voltage, the output signal (when combined with the read outs from the other pixels in the sensor) results in a traditional image being captured. At the same time, the derivative output may be read out on the derivative signal bus 910 (similar to the read bus 110 of FIG. 1). In this way, both a traditional image, as well as the derivative signal, may be obtained within the same combine pixel imager 900 package.

Figure 10:
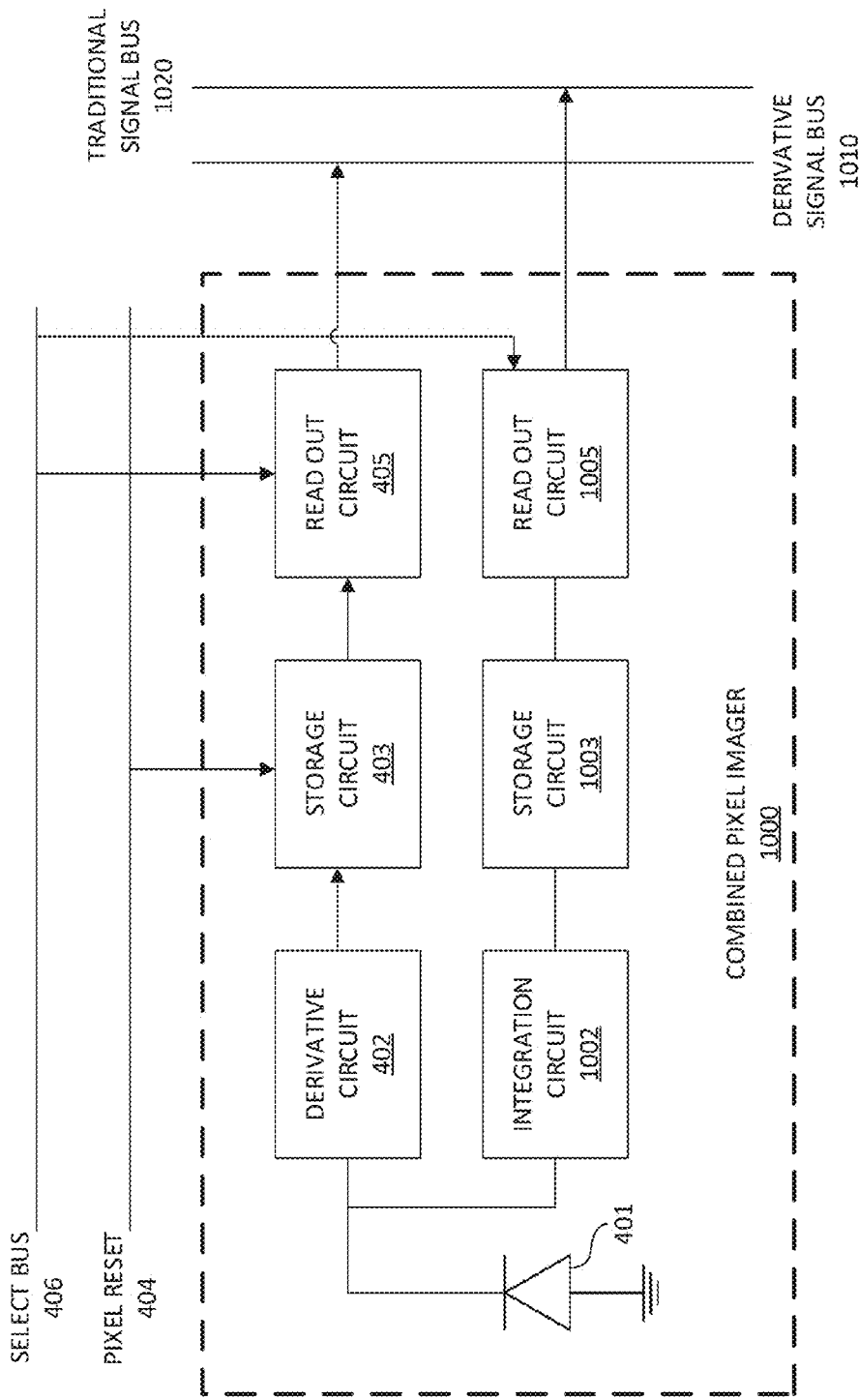
FIG. 10 is a block diagram illustration of an example combined pixel imager in accordance with embodiments of the technology disclosed herein.

FIG. 10 is a block diagram illustration of an example combined pixel imager 1000 in accordance with embodiments of the technology disclosed herein. The illustrated example combined pixel imager 1000 is a block diagram representation of the combined pixel imager 900 discussed with respect to FIG. 9. Referring to FIG. 10, the combined pixel imager 1000 includes common components to the filtering pixel 400 discussed with respect to FIG. 4. In this way, the derivative may be integrated (through 402, 403, 405) so that changes during a frame can be stored and read out using standard select bus and read bus (derivative signal bus 1010) architecture. At the same time, the integration circuit 1002 integrates the current of the photodiode 401 to generate a traditional read out signal (i.e., capturing the entire scene within the FOV of the combined pixel imager 1000). In various embodiments, the integration circuit 1002 contains the components comprising the integrator in FIG. 9 (i.e., resistor 901, capacitor 902). The storage circuit 1003 and read out circuit 1005 operate in a manner similar to the storage circuit 403 and read out circuit 405, with the read out circuit 1005 connected to the traditional signal bus 1020 instead of the derivative signal bus 1010.

Figure 11:
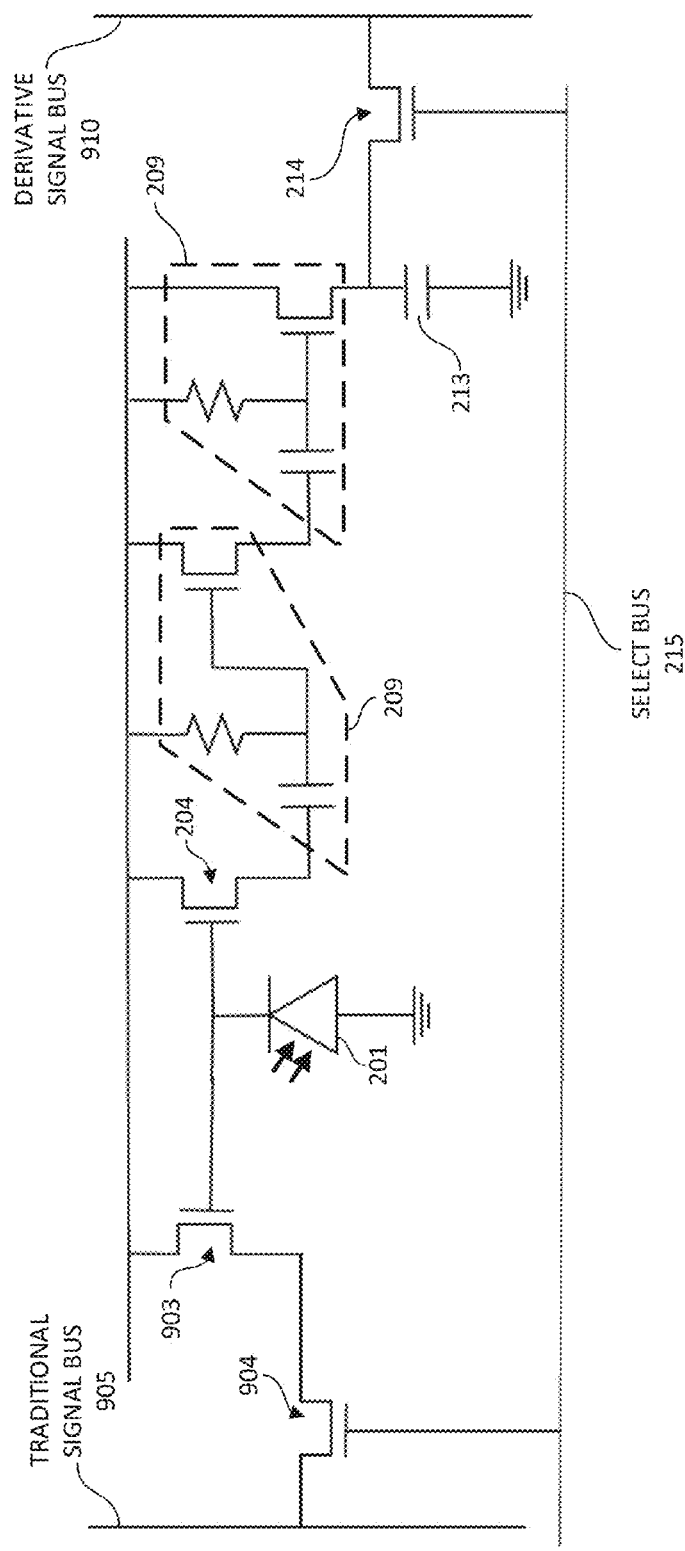
FIG. 11 illustrates another example combined pixel imager for accumulating charge in accordance with embodiments of the technology disclosed herein.
Figure 12:
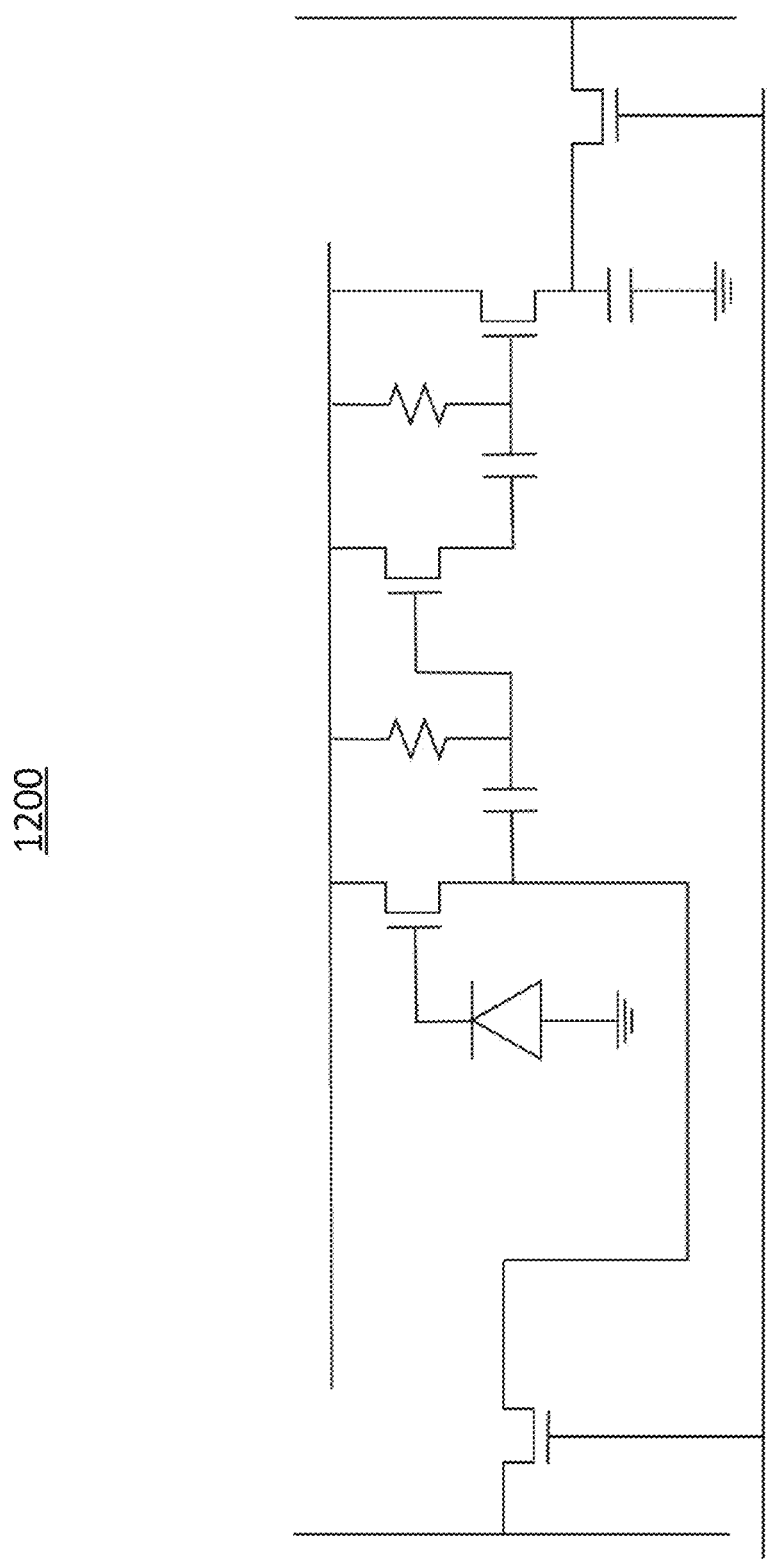
FIG. 12 illustrates another an example simplified combined pixel imager for accumulating charge in accordance with embodiments of the technology disclosed herein.

In some cases, the amount of light falling on the photodiode may be very small. For such low intensity changes, it may be beneficial to include a charge accumulator and buffer before the differentiator, similar to the example filtering pixel 200 discussed with respect to FIG. 2. FIG. 11 illustrates another example combined pixel imager 1100 for accumulating charge in accordance with embodiments of the technology disclosed herein. For ease of discussion, similar components in FIG. 11 are referenced using the same numerals as used in FIGS. 2 and 9, and should be understood to function in a similar manner as discussed above. Inclusion of the buffer FET 204 isolates the photodiode 201, enabling for the additional capacitor 902 and resistor 902 to be removed from the circuit illustrated in FIG. 9. This further renders the FET 903 redundant. In various embodiments, the FET 903 may be removed (an example simplified combined pixel imager 1200 is illustrated in FIG. 12). Additional differentiators may be included in some embodiments to create a higher order derivative circuit (e.g., double derivative; triple derivative), in a manner similar to the example double derivative pixel 600 discussed with respect to FIG. 6.

Figure 13:
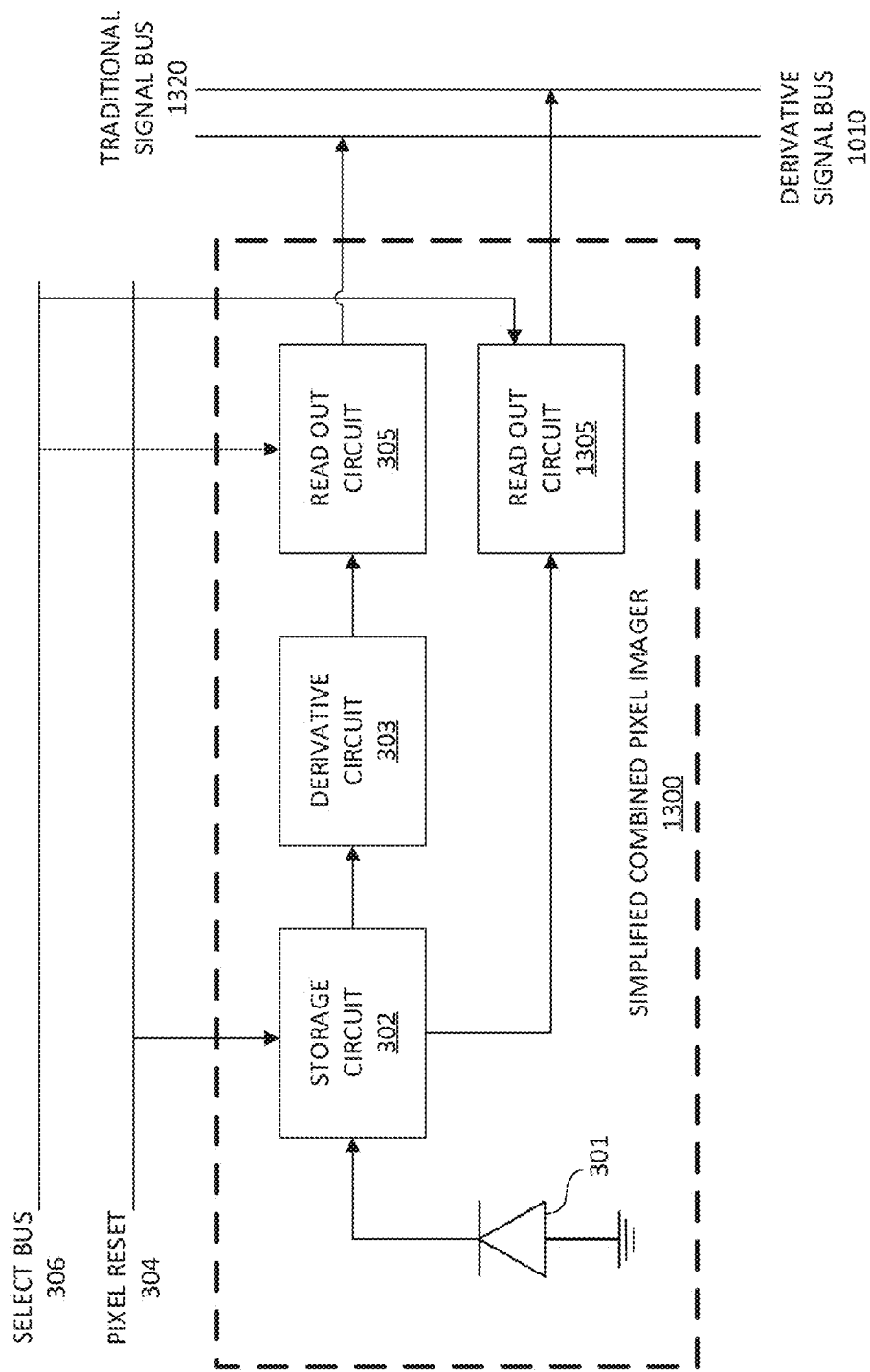
FIG. 13 is a block diagram illustration of an example simplified combined pixel imager in accordance with embodiments of the technology disclosed herein.

When the redundant FET is removed, the combined pixel imager can be simplified. FIG. 13 is a block diagram illustration of the example simplified combined pixel imager 1300 in accordance with embodiments of the technology disclosed herein. As illustrated in FIG. 13, the simplified combined pixel imager 1300 may include similar components as discussed with respect to FIG. 3. Accordingly, for ease of discussion, similar components in FIG. 13 are referenced using the same numerals as used in FIG. 3, and should be understood to function in a similar manner as discussed above. Unlike the combined pixel imager 1000 of FIG. 10, the simplified combined pixel imager 1300 can provide dual read out of the traditional signal as well as the derivative signal with only the addition of a second read out circuit 1305 for the traditional imaging function.

Traditional CMOS APSs contain an array of pixels, and have been implemented in many different devices, such as cell phone cameras, web cameras, DSLRs, and other digital cameras and imaging systems. The pixels within this array capture only the total amount of light falling on the photodiode (photodetector) of the pixel, necessitating computationally intensive frame subtraction and other techniques in order to identify motion within the images. By replacing the array of traditional pixels with an array of filtering pixels as those discussed with respect to FIGS. 1-13, it is possible to capture the motion occurring within a frame, in lieu of or in addition to capturing the entire frame (like a traditional pixel).

The embodiments discussed with respect to FIGS. 1-13 enable measurement of motion within the frame that is in-plane, i.e. parallel to the surface of the image sensor. To provide measurement of out-of-plane motion (i.e., motion towards and away from the image sensor), an illumination of the scene can be used to convert out-of-plane motion to variations in intensity, which the filtering image sensor previously described can detect. For example, a structured light illumination where some sections are illuminated and others are dark can create intensity fluctuations on the object, and these fluctuations in intensity can be detected with the filtering pixel technology. In such embodiments, a known pattern of light (e.g., grids) is projected onto the scene and, based on the deformation caused by striking the surface as an object in the scene moves towards or away from the camera, the rate of motion may be calculated. In various embodiments, imperceptible structured light (e.g., infrared) may be utilized as to not impair the visual capture of the entire scene.

Figure 14:
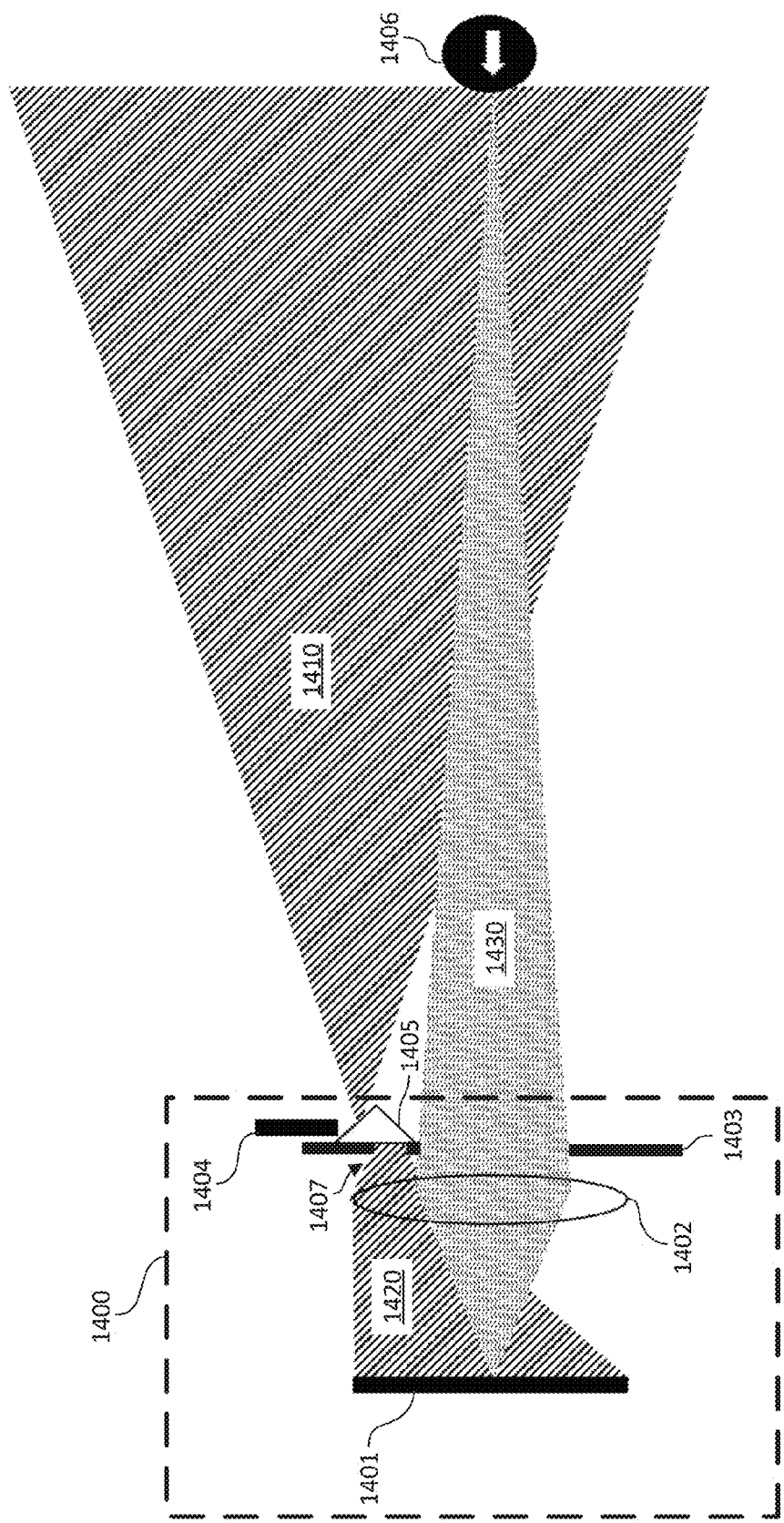
FIG. 14 illustrates an example direct motion measurement camera in accordance with the technology of the present disclosure.

In some embodiments, a coherent laser radar component may be added to the implementation. FIG. 14 illustrates an example direct motion measurement camera 1400 in accordance with the technology of the present disclosure. The direct motion measurement camera 1400 includes an image sensor 1401. The image sensor 1401 includes an array of filtering pixels similar to the filtering pixels discussed above with respect to FIGS. 1-5 in some embodiments. In other embodiments, the image sensor 1401 includes an array of higher order filtering pixels similar to the higher order filtering pixels discussed with respect to FIGS. 6-8. The image sensor 1401 may include a combined pixel imager similar to the combined pixel imager discussed with respect to FIGS. 9-13, in various embodiments. The direct motion measurement camera 1400 further includes an imaging system, comprising a lens 1402 and an aperture stop 1403. The imaging system serves to ensure that light is directed correctly to fall on the image sensor 1401. In various embodiments, the direct motion measurement camera 1400 may include filtering pixels discussed with respect to FIGS. 21-23.

To provide the out-of-plane motion measurement, the direct motion measurement camera 1400 takes advantage of the Doppler shift. A laser diode 1404 is disposed on the surface of the aperture stop 1403. The laser diode 1404 emits a laser towards a prism 1405. The light emitted from the laser diode 1404 is divergent, and the divergence angle of the laser may be set by a lens (not shown) of the laser diode 1404. In various embodiments, the divergence angle may be set to match the diagonal FOV of the camera 1400. Polarization of the light emitted from the laser diode 1404 may be selected to avoid signal loss from polarization scattering on reflection from the moving object 1406. In some embodiments, the polarization may be circular; in other embodiments, linear polarization may be used. To eliminate speckle fading, the pixel size of the image sensor may be matched to the airy disk diameter of the imaging system in various embodiments.

The prism 1405 has a first power splitting surface (the surface closest to the laser diode 1404), which reflects the light 1410 emitted by the laser diode 1404 outwards away from the camera. In addition, a portion of the light emitted from the laser diode 1404 passes through the first surface of the prism and reflects 1420 off of a second, interior surface of the prism 1405 towards the lens 1402 of the imaging system, through an opening 1407 in aperture stop 1403. The prism 1405 is designed as a band pass filter corresponding to the wavelength of the light emitted from the laser diode 1404. Accordingly, the prism 1405 is opaque (like the aperture stop 1403) to visible light.

As can be seen in FIG. 14, the light 1410 that is transmitted outwards away from the camera 1400 reflects off of a moving object 1406 back towards the camera 1400 (as illustrated at 1430). The lens 1402 captures the returning light 1430 through the aperture stop 1403, and focuses the returning light 1430 onto the pixel on the image sensor 1401 corresponding to the location of the moving object 1406.

The returning light 1430 off of the moving object 1406 is shifted in frequency by the Doppler shift. If the moving object 1406 was stationary instead, no shift in the frequency would occur. For the moving object 1406, however, the shift in frequency is proportional to the velocity of the moving object 1406. Accordingly, the reflected light 1420 and the returning light 1430 each have a different frequency. When the two lights combine on the image sensor 1401, a beat frequency is generated that is equal to the difference in the frequencies between the reflected light 1420 and the returning light 1430. By measuring this beat frequency, the direct motion measurement camera 1400 may measure motion towards or away from the camera without the need for additional post-processing. The filtering pixel sensor previously described can detect the beat frequency since the derivative of a sine wave is a cosine wave. Thus, the first derivative sensing circuit will sense the same as the double derivative circuit. Also, the positive derivative and the negative derivative circuits will also detect the same signal. This is different than any other intensity variation that the pixel may detect, related to lateral motion of the object.

Figure 15:
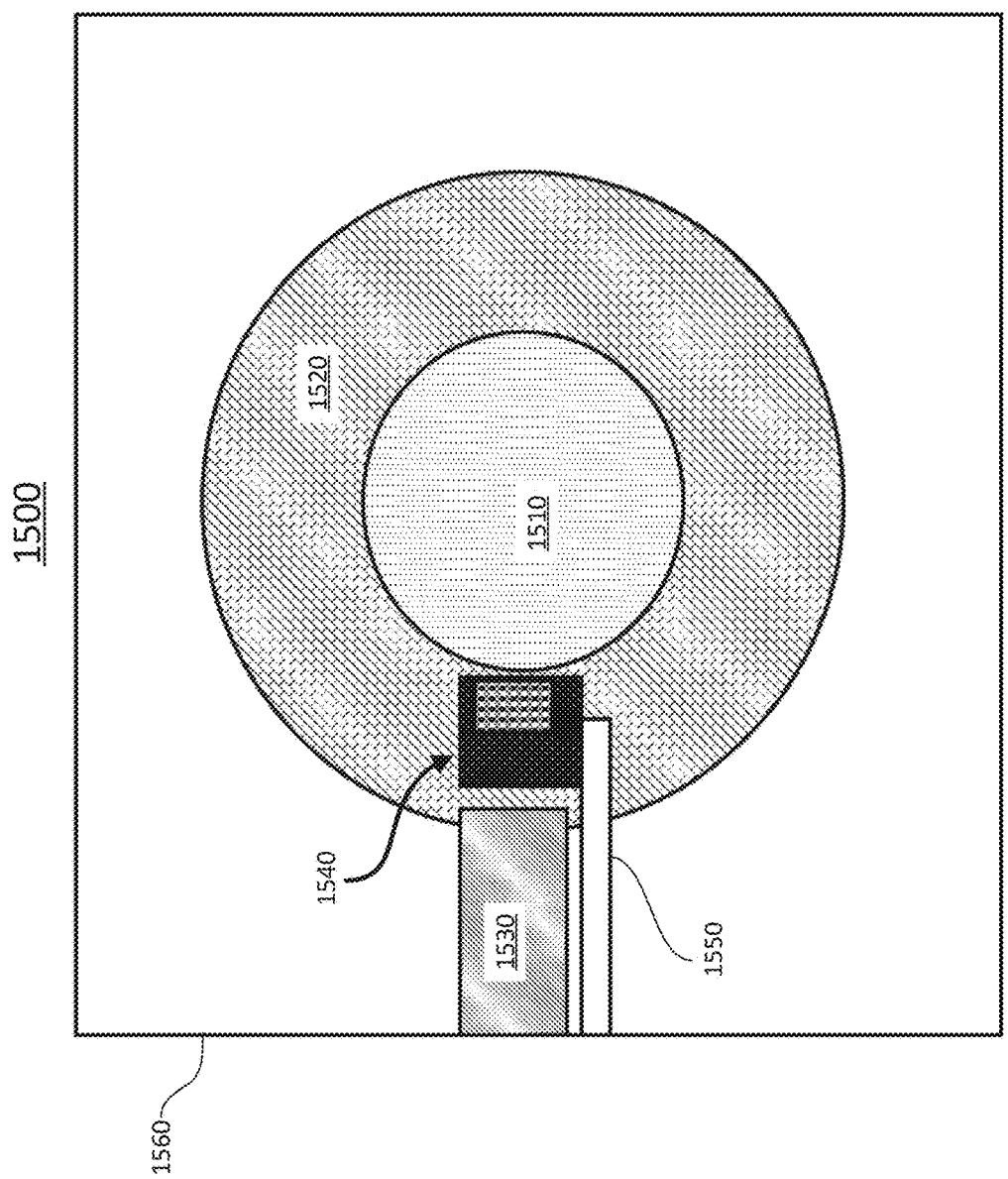
FIG. 15 illustrates an example direct motion measurement camera with dithering in accordance with embodiments of the technology disclosed herein.

In some embodiments, not only can the velocity of motion in the out-of-plane direction be measured, but the direction of the out-of-plane motion may also be measured. By dithering the prism, the frequency of the outgoing light (1410 in FIG. 14) can be changed relative to the reflected light (1420 in FIG. 14). By doing this, the direction of motion of the moving object may be detected. Moreover, the beat frequency can be further distinguished from the object's in-plane motion. FIG. 15 illustrates an example direct motion measurement camera with dithering 1500 in accordance with embodiments of the technology disclosed herein. The direct motion measurement camera with dithering 1500 has a similar configuration to the direct motion measurement camera 1400 discussed with respect to FIG. 14. Referring to FIG. 15, the direct motion measurement camera with dithering 1500 includes a lens 1510, aperture stop 1520, laser diode 1530, prism 1540, an actuator 1550, and a housing 1560. Although not pictured, an image sensor is disposed behind the lens 1510 and within the housing 1560, and may be similar to the image sensor discussed with respect to FIG. 14. The prism 1540 is positioned over the opening in the aperture stop 1520 (the opening is shown by the cross-hatched rectangle in the prism 1540).

To provide the dither, the prism 1540 is connected to an actuator 1550. In various embodiments, the actuator 1540 may be a microelectromechanical system (MEMS) actuator, such as the actuator disclosed in U.S. patent application Ser. No. 15/133,142. The actuator 1540 may be configured such that the prism 1540 adds to Doppler shift during even frames, but subtracts from Doppler shift during odd frames. When Doppler shift is positive (i.e., objects are moving towards the camera), even numbered frames will have a larger Doppler shift than odd numbered frames. When Doppler shift is negative (i.e., objects are moving away from the camera), even numbered frames will have a smaller Doppler shift than odd numbered frames.

Although discussed with respect to embodiments employing coherent light, the dithering element may be utilized with other forms of illumination as well. For example, embodiments of the technology disclosed herein utilizing structured light may include the dithering effect to take advantage of Doppler shift. Nothing in this specification should be interpreted as limiting the use of the prism and dithering component described to a single illumination technique. A person of ordinary skill in the art would appreciate that the dithering technique is applicable wherever the Doppler shift could be utilized to identify out-of-plane motion of objects within the FOV of the derivative sensor.

As discussed above, cameras implementing the technology discussed herein provide advantages over traditional cameras. Frame subtraction is not needed in order to determine motion within the frame. The derivative circuits and image sensors discussed above with respect to FIGS. 1-15 allow for direct measurement of motion of object within a frame. Only the number and size of the motion is captured through the derivative circuit, making it easier to separate a moving object from the background and identifying the moving object. By combining the derivative sensing technology with a traditional pixel circuit, it is possible to both collect visual images of the entire scene (like a conventional camera) and also capture only the motion within the scene, at the same time. The ability to capture the motion of objects through the scene is useful for many different types of applications, including the security, gesture recognition, obstacle avoidance, and target tracking applications discussed, among others. The implementations enable only the motion in the scene to be captured, making it easier to differentiate between the background elements and the moving object.

As an example, a camera in accordance with embodiments of the technology disclosed herein may be built for use in cellular devices. In one embodiment, an aperture size of 2.5 mm diameter and an F number of 2.8 (traditional size of a camera in a cellular device) can be assumed. A FOV can be 74.5 degrees. To avoid speckle fading, the filtering pixel size may be set to be smaller than 6.59 μm (dependent on the aperture size and F#). The camera resolution can be assumed to be 1.25 megapixels, or 0.94 mm lateral resolution at 1 m distance. Also, a laser diode power of 100 mW can be assumed. If there is an object moving at 1 m away from the camera, about 90 mW of the laser diode power may be used to illuminate the object at this distance, and an illumination equivalent to about 2 lux in the visible (1 lux is 1.46 mW/m^2 at 555 nm) can be assumed. Assuming 30% diffuse object reflectivity, the power received per pixel is 7e-15 W or 354 photons per frame running at 100 fps. A high pass filter can be placed on each filtering pixel that only detects between 1 kHz and 100 MHz frequencies. Thus, object motion can be between 0.49 mm/sec (1.8 m/hr) and 49 m/sec (176 km/hr) can be detected. In this arrangement, there are over 16 bits of dynamic range.

Figure 18:
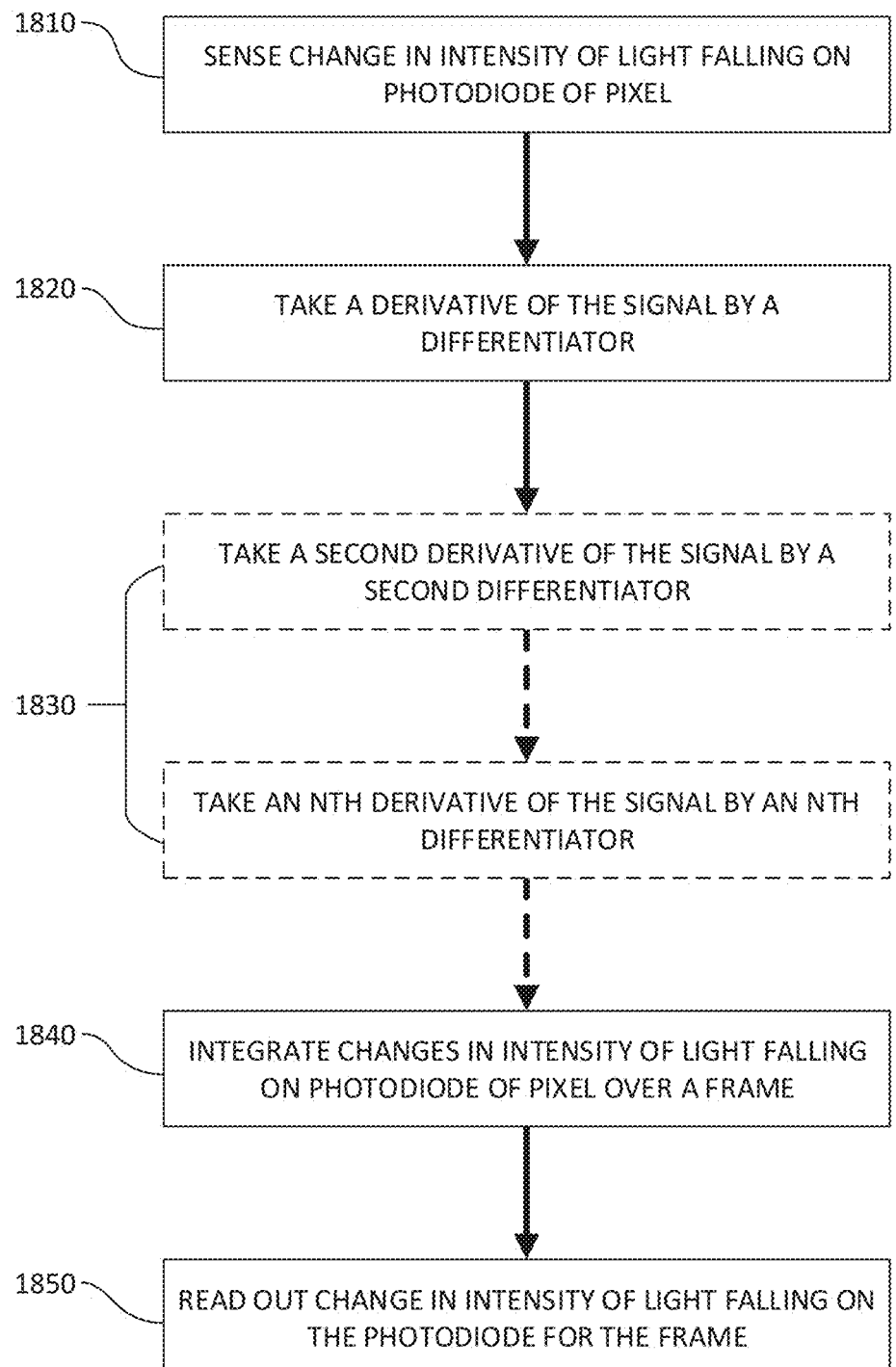
FIG. 18 illustrates an example method of detecting motion within the field of view of a pixel in accordance with embodiments of the technology disclosed herein.

FIG. 18 illustrates an example method of detecting motion within the field of view of a pixel. At 1810, a change in intensity of light falling on a photodiode of a pixel is sensed. This sensing may be similar to the sensing discussed above with respect to the photodiode of FIGS. 1-15. As the intensity of light falling on the photodiode changes, the current flowing out of the photodiode to the drain voltage ($V_{dd}$) varies, varying the voltage of the signal. This change in intensity generates an AC component to the output voltage (signal). In some embodiments, this may be sensed through a resistor, such as resistor 103 discussed with respect to FIG. 1. In such embodiments, the signal may be proportional to the intensity of the light falling on the photodiode. In various embodiments, the change in intensity may be sensed through a source follower transistor, such as the buffer FET 204 discussed above with respect to FIG. 2. In such embodiments, the output of the source follower is proportional to the integral of the intensity of the light falling on the photodiode.

At 1820, a differentiator takes a derivative of the voltage. The derivative of the output signal from 1810 is the change in intensity of the light falling on the photodiode. In various embodiments, the differentiator may comprise a capacitor, resistor, and a FET. In some embodiments, additional derivatives of the signal may be taken to measure different aspects of the signal. In embodiments where a source follower is utilized (such as, for example, the buffer FET 204 discussed above with respect to FIG. 2), two differentiators may be used to obtain the first derivative of the signal. As discussed above with respect to FIG. 2, in such embodiments the output from the source follower (buffer FET) is proportional to the integral of the intensity of light falling on the photodiode. Accordingly, the signal from 1810 must first be processed to obtain a signal proportional to the intensity of the light falling on the photodiode, and then the first derivative may be taken.

When applicable, additional derivatives may be taken at 1830. Additional derivatives are possible by including an additional differentiator in the circuit prior to integration (represented by the nth derivative in FIG. 18). As additional higher order derivatives are an option, 1830 is illustrated as a dashed box. If no higher order derivatives are taken, the method would go from 1820 to 1840.

At 1840, the derivative signal is integrated. In various embodiments, a capacitor may be used to integrate the derivative signal. At 1850, the integrated signal is read out on a read bus. In various embodiments, a row select FET may be utilized to read out the integrated signal.

In addition to filtering out derivatives of the intensity of light, filtering pixels in accordance with embodiments of the technology disclosed herein may include a sampling filter. In signal processing, sampling filters are digital filters that operate on discrete samples of an output signal from an analog circuit (e.g., a pixel). As it is in the digital domain, sampling requires that the analog output signal from the circuit is converted into a digital signal through an A/D converter. A microprocessor applies one or more mathematical operations making up the sampling filter to the discrete time sample of the digitized signal. However, such processing is time- and resource-intensive. Moreover, the effectiveness of the process is limited by the quality of the analog signal outputted from the circuit.

By including a sampling filter within the pixel itself, the usefulness of sampling filters used in the digital domain can be realized in the analog domain of the pixel circuit. In other words, various embodiments of the technology disclosed herein provide filtering pixels providing a hybrid analog-digital filtering capability within the pixel itself. By including a pseudo-digital filter circuit, such filtering pixels can perform digital-like sampling of the analog signal, without the need for an A/D converter.

For example, filtering pixels including a pseudo-digital filter may filter out undesired light sources. This capability can be used, for example, to address light saturation caused by high-intensity light sources (e.g., the sun). In some embodiments, this capability can be used to improve visibility in certain conditions, e.g., foggy conditions. That is, filtering pixels can be used to better identify moving objects through the fog. In some embodiments selective lighting filtering can be used to allow viewing only those objects illuminated by a particular code. As discussed above, traditional pixels used in image sensors integrate the total intensity of light falling on its photodiode during a frame. That is, each pixel can be thought of as a well, accumulating captured light corresponding to an increase in the total intensity of light captured. As with physical wells, however, the amount of light that may be captured by each pixel is limited by its size. When a pixel approaches its saturation limit, it loses the ability to accommodate any additional charge (caused by light falling on the photodiode). In traditional cameras, this results in the excess charge from a saturated pixel to spread to neighboring pixels, either causing those pixels to saturate or causing errors in the intensity outputted by those neighboring pixels. Moreover, a saturated pixel contains less information about the scene being captured due to the maximum signal level being reached. After that point, additional information cannot be captured as the pixel cannot accommodate anymore intensity.

Figure 22:
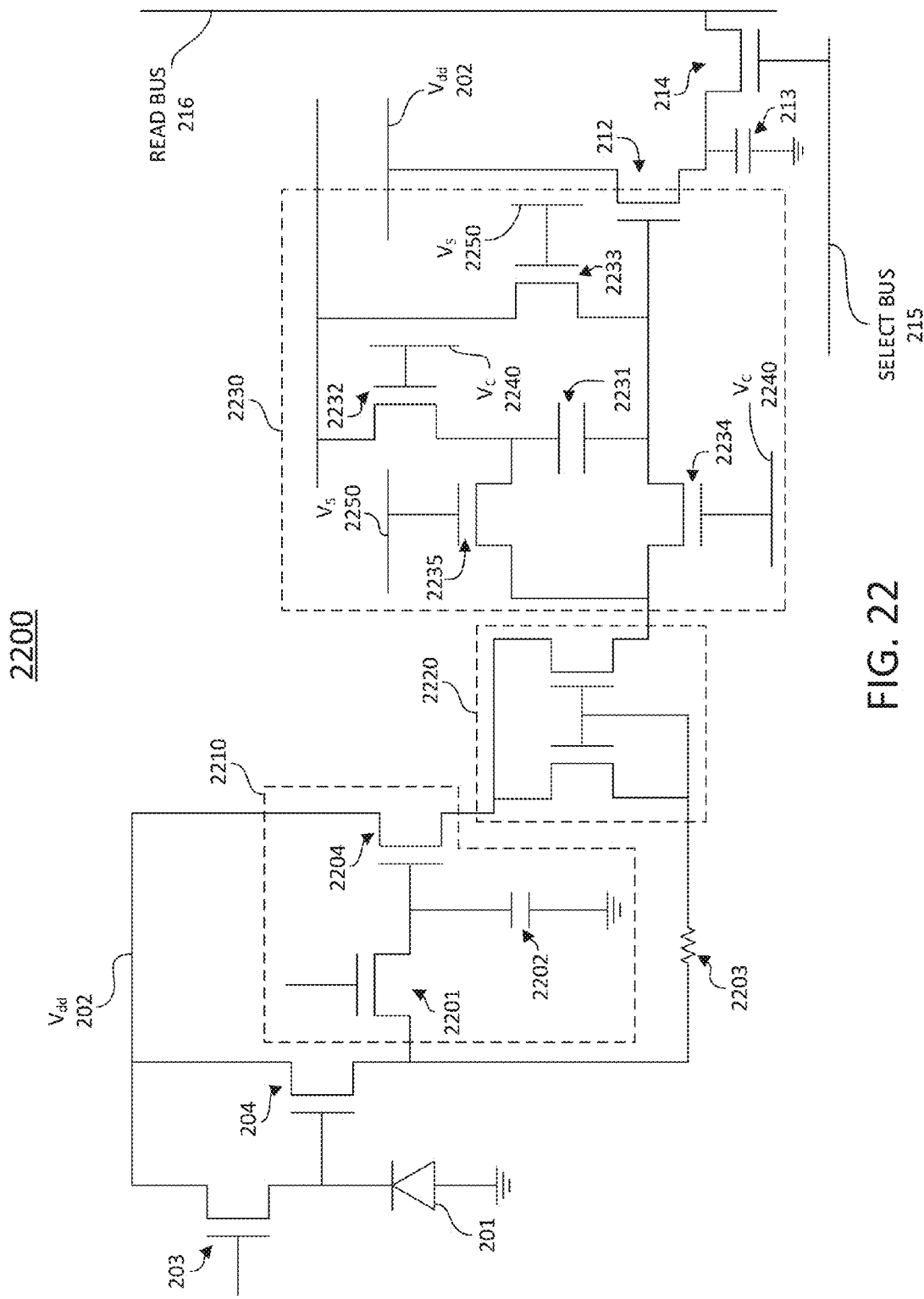
FIG. 22 illustrates an example filtering pixel including a pseudo-digital filter in accordance with various embodiments of the technology disclosed herein.

FIG. 22 illustrates an example filtering pixel 2200 including a pseudo-digital filter in accordance with various embodiments of the technology disclosed herein. The example filtering pixel 2200 is similar to the filtering pixel 200 discussed with respect to FIG. 2, with a different filtering capability disclosed. Like referenced elements operate similar to those described with respect to FIG. 2.

As illustrated in FIG. 22, the filtering pixel 2200 includes a sample-and-hold filter 2210. The sample-and-hold filter 2210 enables pseudo-digital sampling in the analog domain. The output from the buffer FET 204 (or source follower) goes through the sample-and-hold circuit 2210, which stores a sample of a previous intensity of light falling on the photodiode 201. A sample FET 2201 is included, which can be controlled to identify when a sample of the output from the buffer FET 204 is to be taken and stored in a sample capacitor 2202. The length of the sample can be controlled by controlling the operational voltage applied to the sample FET 2201. In some embodiments, the sample may be a one-time, instantaneous sample of the output from the buffer FET 204, while in other embodiments the sample FET 2201 may be held open for a duration to accumulate a longer sample. The sampling rate depends on the particular implementation and the information of the signal desired to be identified and processed. The sample-and-hold circuit 2210 enables a wide range of sampling-based filtering to be applied in the analog domain. A sample source follower 2204 serves to isolate the sample capacitor 2202 from the rest of the circuit.

The current mirror 2220 serves to copy a current from one active device in a circuit to another active device, ensuring that the output current of the mirror remains constant regardless of loading on the circuit. In some embodiments, the resistor 2203 may be implemented as a switched capacitor. The resistor 2203 is used to compare the sampled voltage output from the FET 2204 with the instantaneous voltage from the FET 204 to set a current input to the current mirror 2220. The voltage from the resistor 2203 serves to control the current mirror FETs. The sample from the sample FET 2201 is outputted to the current mirror 2220 through an output FET 2204. The current mirror 2220 compares voltages of the sample from the sample capacitor 2203 with the voltage of the output from the buffer FET 204 to generate a magnitude of the current. That is, the current mirror 2220 generates a current (through resistor 2203) with a magnitude proportional to the different between the voltage of the output from the buffer FET 204 and the output from the sample buffer FET 2204 (i.e., the sample held in the sample capacitor 2202).

As the current mirror 2220 generates a current proportional to the difference in voltage between the sample and the output from the photodiode 201, it represents the average intensity of light between the two times. In other words, the current at the current mirror 2220 is proportional to the current on the photodiode 201. If no light falls on the photodiode 201, the sample and the output from the photodiode 201 are equal, and no current flows through the current mirror 2220. By creating a copy of the current generated by the photodiode, it frees us up to operate on this current using pseudo-digital analog filtering. Using current subtraction allows for the current to be added or subtracted, either by charging or discharging a capacitor 2231 of a current subtractor 2230. Two operation FETs 2232 and 2233 are used to bias one side or the other of capacitor 2231, are used in conjunction with two FETs 2234 and 2235 that open up the current output to one side or the other of capacitor 2231 from the current mirror 2220. That is, the voltage across the capacitor 2231 increases when FET 2232 and FET 2234 are selected (charging), while the voltage across the capacitor 2231 decreases when FET 2233 and FET 2235 are selected (discharging). A voltage 2240 ($V_C$) is used to control the FETs 2232, 2234, and voltage 2250 ($V_S$) is used to control the FETs 2233, 2235.

One skilled in the art will realize that many other circuit designs for taking out the current from the photodiode 201 exist. For example, the current from the photodiode can be taken out directly and fed into the current subtractor 2230 to perform the filtering.

The coefficients for the filter are set by determining the sign and magnitude. The "sign" refers to the polarization of the filter. The sign of the coefficient is selected by the digital signals that control the FETs 2232, 2233, 2234 and 2235. If the capacitor 2231 is charged, the coefficient is positive, and if the capacitor 2231 is discharged, the coefficient is negative. In various embodiments, the sign of the filter may be synchronized with a modulation scheme, such that a change in the sign of the filter is tied to a specific pattern of a modulated source. In other embodiments, the sign of the filter may be determined in an asynchronous manner, allowing the filter to be programmed independently of a particular modulation scheme utilized. The magnitude of the coefficient is set by adjusting the resistor 2203, which, if using a switched capacitor, can be changed by adjusting the switching frequency. The magnitude may be adjusted in the same way as the sign discussed above (i.e., synchronously or asynchronously).

The current subtractor 2230 is similar to the differentiator 205 discussed with respect to FIG. 2. A differentiator is a circuit that is designed such that the output is proportional to the rate of change. In the example discussed above with respect to FIG. 2, the resistor and capacitor served to output the derivative of the intensity of the light falling on the photodiode directly (i.e., on the continuous signal). In the example filtering pixel of FIG. 22, the current subtractor 2230 outputs the proportional rate of change in the sampled signal when one current sample is charging the capacitor 2231 and the next is discharging the capacitor 2231. In various embodiments, the current subtractor 2230 of FIG. 22 may be replaced with a differentiator 205 to output the derivative of the sampled signal. In some embodiments, the differentiator 205 in FIG. 2 can be replaced with a current subtractor 2230 as discussed with respect to FIG. 22 to provide the intensity of the light minus any unwanted intensity.

Each filtering pixel 2200 includes its own integrator, comprising FET 212 and capacitor 213. The integrator serves to produce a representative output of the filtering output from the subtractor 2230. By including an integrator with each filtering pixel 2200 enables the specific signal from each filter to be read out over the read bus 216, as opposed to simply outputting the signal falling on the photodiode as in a traditional pixel array. Based on operation of read out FET 214 using the select bus 215, the filtered signal can be outputted on the read bus 216.

Through operation of the FETs 2232, 2233, 2234, 2235, the filtering pixel 2200 may be programmable, enabling different types of output signals to be read out on the read bus 216. For example, in various embodiments the filtering pixel 2200 may be programmed to function as a traditional pixel (i.e., simply outputting the total intensity falling on the photodiode over a period of time) by setting the FETs 2232, 2233, 2234, 2235 such that the capacitor 2231 is always charging, and then outputting the total intensity through the FET 212. In other embodiments, the FETS 2232, 2233, 2234, 2235 may be programmed as discussed above to add or subtract samples.

Figure 23A:
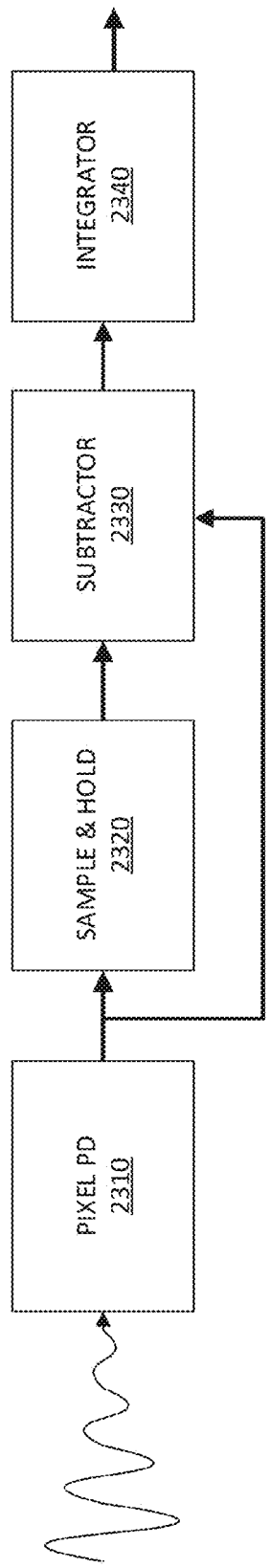
FIGS. 23A and 23B illustrate example implementations of the filtering pixel described with respect to FIG. 22.
Figure 23B:
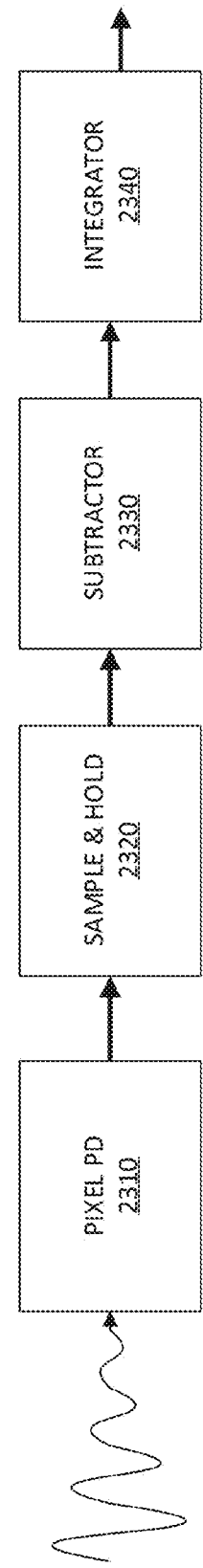

FIGS. 23A and 23B illustrate example implementations of the filtering pixel described with respect to FIG. 22. The diagrams in FIGS. 23A and 23B are similar to the diagram of the general operation illustrated in FIG. 21, with the sample-and-hold 2320 and subtractor 2330 comprising the filter 2130 discussed with respect to FIG. 21. The diagram of FIG. 23A illustrates the filtering pixel 2200 as illustrated in FIG. 22. That is, the output from the photodiode 2310 goes through the sample-and-hold filter 2320 which takes a sample of the output from the photodiode 2310. The sample is compared against the instantaneous voltage from the photodiode 2310 in the subtractor 2330. In various embodiments, the current mirror discussed with respect to FIG. 22 may be included in the sample and hold 2320 or the subtractor 2330. The output from the subtractor 2330 is then integrated in the integrator 2340.

In FIG. 23B, a variation is shown wherein the difference between various samples is filtered. That is, the sample and hold 2320 includes two or more sample and hold filters like the sample and hold filter 2210 discussed with respect to FIG. 22.

Figure 28:
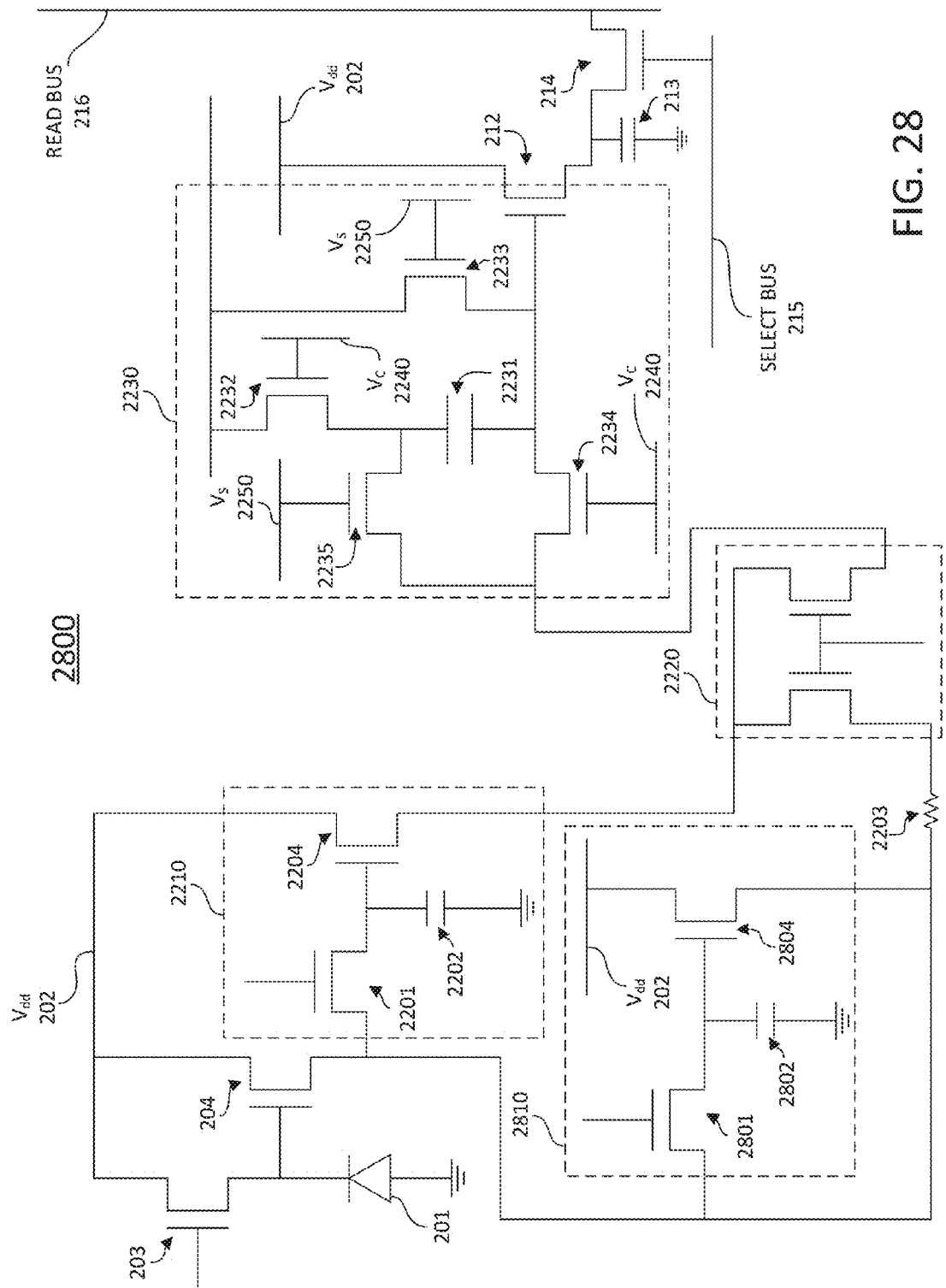
FIG. 28 illustrates an example filtering pixel with multiple sample and hold filters in accordance with various embodiments of the technology disclosed herein.

FIG. 28 illustrates an example embodiment of a filtering pixel 2800 with multiple sample and hold filters in accordance with various embodiments of the technology disclosed herein. As illustrated in FIG. 28, the filtering pixel 2800 is similar to the filtering pixel 2200 discussed with respect to FIG. 22, and similar referenced elements function in a similar manner. The filtering pixel 2800 includes a second sample and hold filter 2810, comprising a second sample FET 2801, sample capacitor 2802, and a sample source follower FET 2804. In this way, the difference between different samples (i.e., the difference between the sample from sample and hold filter 2210 and the sample from sample and hold filter 2810) can be filtered and used to set a current input to the current mirror 2220.

The number of sample and hold filters that can be implemented within the circuit is not limited to only two. In various embodiments, the filtering pixel 2800 may include more than two sample and hold filters, with operational switches for determining which samples will be compared for determining the current to be outputted by the current mirror 2220. A person of ordinary skill in the art in view of the current disclosure would understand how to connect multiple sample and hold filters in a pixel.

Figure 24:
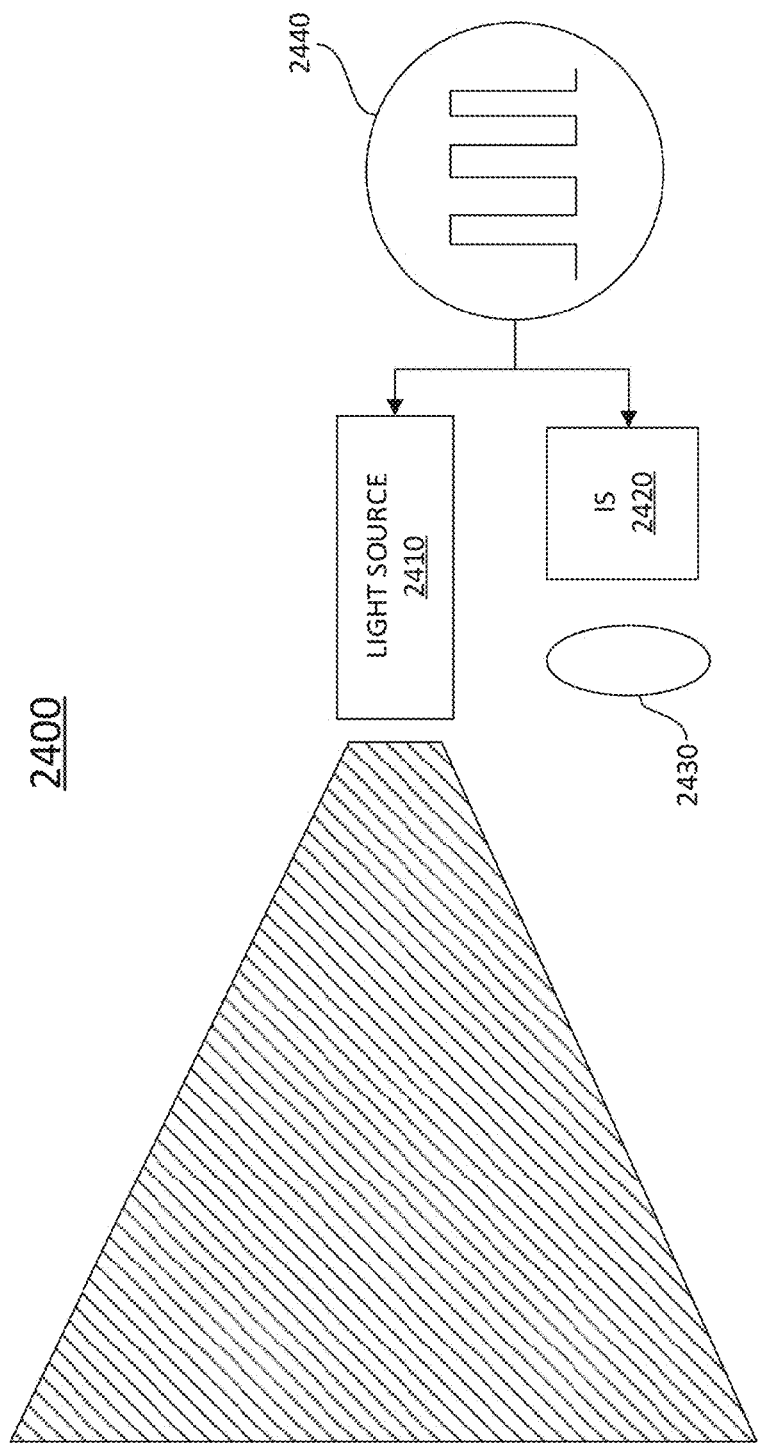
FIG. 24 illustrates an example imaging system implementing an image sensor with filtering pixels configured with such filtering capability.

To filter out unwanted light sources, one method involves the use of a modulated light source. FIG. 24 illustrates an example imaging system 2400 implementing an image sensor with filtering pixels configured with such filtering capability. The imaging system 2400 includes a light source 2410, an image sensor 2420, and a lens 2430. In the illustrated embodiment, the light source 2410 is a modulated light source. In this manner, light with a known modulation scheme 2440 can outputted into the scene sought to be captured by the image sensor 2420. Because the modulation 2440 is known, the filtering pixels of the image sensor 2420 may be configured to use the known modulated light to identify unwanted light sources within the captured light and remove those. In various embodiments, the light outputted from the light source 2410 may be amplitude modulated, phase modulated, or polarization modulated. In various embodiments, the modulation 2440 may be a square wave, pulse train, sinusodial wave, or pseudo-random. In various embodiments, the modulation 2440 is not periodic over the entire frame. In various embodiments, the modulation 2440 may be coded, similar to code-division multiplexing used in cellular communication. In this way, the filtering pixel of the image sensor 2420 may be programmable, and may select different codes to filter out different unmodulated light. The type of modulation may depend on the type of unwanted light sought to be filtered out by the filtering pixels of the image sensor 2420.

The image sensor 2420 may include an array comprising filtering pixels capable of filtering out undesired light sources. In various embodiments, the array may consist of filtering pixels similar to the filtering pixel 2200 discussed with respect to FIG. 22. In other embodiments, the array may include additional filtering pixels with other filtering capabilities, such as any of the example filtering pixels discussed with respect to FIGS. 2-13.

In various embodiments, the same modulation scheme 2440 used to modulate the light source 2410 may be used to drive the sample-and-hold and current subtraction portions of the filtering pixel 2200 embodied in the image sensor 2420. In this way, the filtering pixel is capable of sampling the signal from the photodiode in conjunction with the modulation. The modulation allows the filtering pixel to key in on the aspects of the captured light that is desired. In the illustrated embodiment, the light source 2410 and the filtering pixels of the image sensor 2420 are synchronized. In other embodiments, the light source 2410 and the filtering pixels of the image sensor 2420 need not be synchronized, such as when different coded schemes may be used with the modulation 2440. In such embodiments, the filtering pixels may be configured to be able to detect a particular coding scheme being used and drive the filtering components accordingly.

FIG. 25A illustrates when the filtering pixel is configured to determine when an object is illuminated and remove unwanted light sources. In the illustrated example, the modulated illumination is aligned such that the polarity of the filter is aligned with the ON state of the modulation. Any non-modulated light (or light at a different modulation) does not build up on the pixel as the filter rejects the background light (that remains essentially constant to the pixel as it includes equal "−" and"+"). Only the modulated light source builds up as it is aligned with the filter highs.

In addition to using the modulated light source for removing unwanted light sources, this arrangement can be used to also determine when an object is moving in the scene. FIG. 25B illustrates when the filtering pixel is configured to determine when an object is moving. As discussed above, a derivative filter (like that discussed with respect to FIGS. 1-13) could be included in the filtering pixel 2200 discussed above with respect to FIG. 22. By using a modulated light source, the light can be sampled such that only the modulated light is accumulated (filtering out unwanted lights sources). In addition, by flipping the polarity of the filter in the middle of a frame, the derivative can be filtered out to show motion. As shown in FIG. 25B, the polarity flips midway through the frame, such that the second half of the frame has the filter highs ("+") aligned with the OFF state of the modulated light and the filter lows ("−") are aligned with the ON state of the modulated light. Therefore, if the magnitude of the modulated light is not changing during the frame, it would be cancelled out similarly to unwanted light sources. However, if there is motion in the frame the change would be captured. In some embodiments, the polarity of the filter is changed more than once throughout a frame. In some embodiments, the polarity of the filter is not changed, but the illumination shifts midway through the frame, such that the second half of the frame has the filter highs ("+") are aligned with the OFF state of the modulated light and the filter lows ("−") are aligned with the ON state of the modulated light. In these embodiments, the light modulation and the filter polarity work together to determine the filter characteristics. Similarly, to vary the filter coefficient magnitude, either the filter amplitude can be modified for each sample, or the light intensity or both.

Figure 25C:
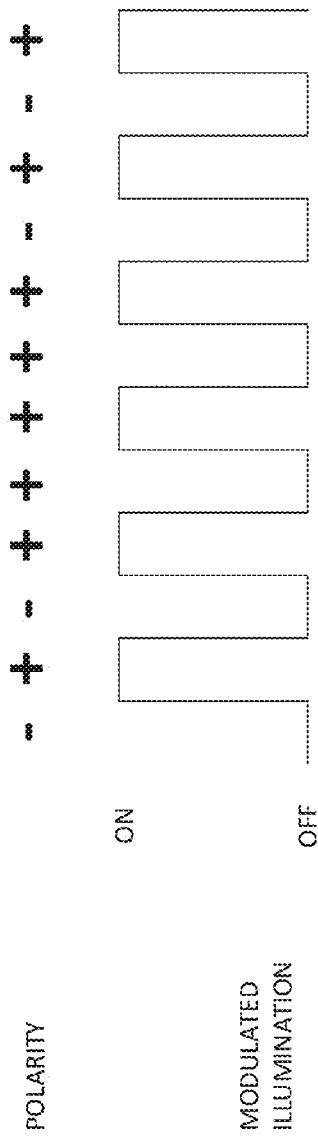
FIG. 25C illustrates an example scheme for switching the filter polarity compared to modulated illumination.
Figure 25D:
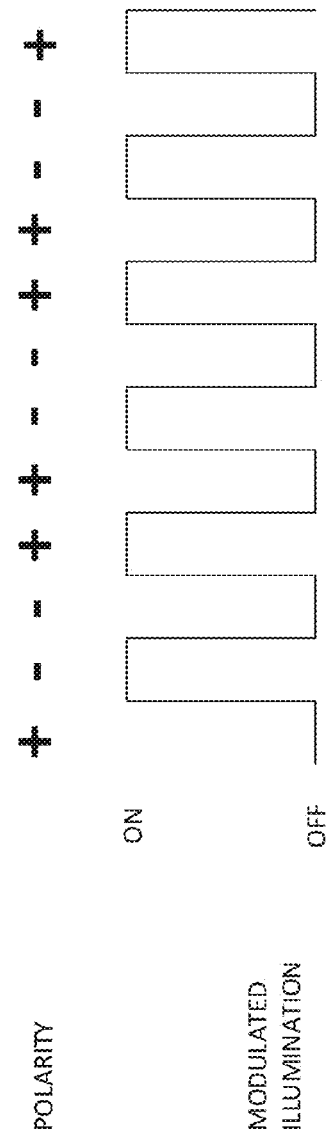
FIG. 25D illustrates another example scheme for switching the filter polarity compared to modulated illumination.

Although FIGS. 25A and 25B illustrate two types of methods of switching the filter polarity compared to the modulated illumination, nothing in this disclosure should be interpreted as limiting the technology to only those two arrangements. FIGS. 25C and 25D illustrate two additional arrangements that are possible in accordance with the technology disclosed herein. A person of ordinary skill in the art would understand that the technology disclosed herein would allow for any number of different arrangements to be programmed into the filtering pixel, allowing for a wide range of outputs to be generated.

In various embodiments, the imaging system 2400 described with respect to FIG. 24 and the motion detection camera system 1400 discussed with respect to FIG. 14 may be combined into a single imaging system. FIG. 26 illustrates an example imaging system 2600 in accordance with various embodiments of the technology disclosed herein. The imaging system 2600 includes the components discussed with respect to FIG. 14, as well as an additional light source 2610. The light source 2610 may be similar to the light source 2410 discussed with respect to FIG. 24. In this way, the imaging system 2600 is configured both to enable out-of-plane motion detection as discussed with respect to FIG. 14, as well as filtering out unwanted light sources as discussed with respect to FIG. 26. In various embodiments, a single light source may be used to accomplish both the out-of-plane motion detection using Doppler shift as well as filtering out unwanted signals using a modulated light source.

Utilizing embodiments of the filtering pixels in accordance with the present disclosure, mission-specific imaging systems may be developed that enable pseudo-digital processing in the analog domain. However, imaging systems capable of performing various different types of filtering may be created implementing in accordance with the technology disclosed herein. For example, in various embodiments the pixel array implemented in an image sensor may include multiple filtering pixels in accordance with the filtering pixels discussed herein, where each filtering pixel is configured to perform a specific type of filtering. For example, the array may include filtering pixels including a derivative filter, filtering pixels including a double derivative filter, and filtering pixels including a sample-and-hold/current subtraction filter. In some embodiments, the array may further include a traditional pixel. In various embodiments, a filtering pixel may be included that has more than one filter type included (e.g., includes both a derivative filter and a sample-and-hold/current subtraction filter).

Figure 27:
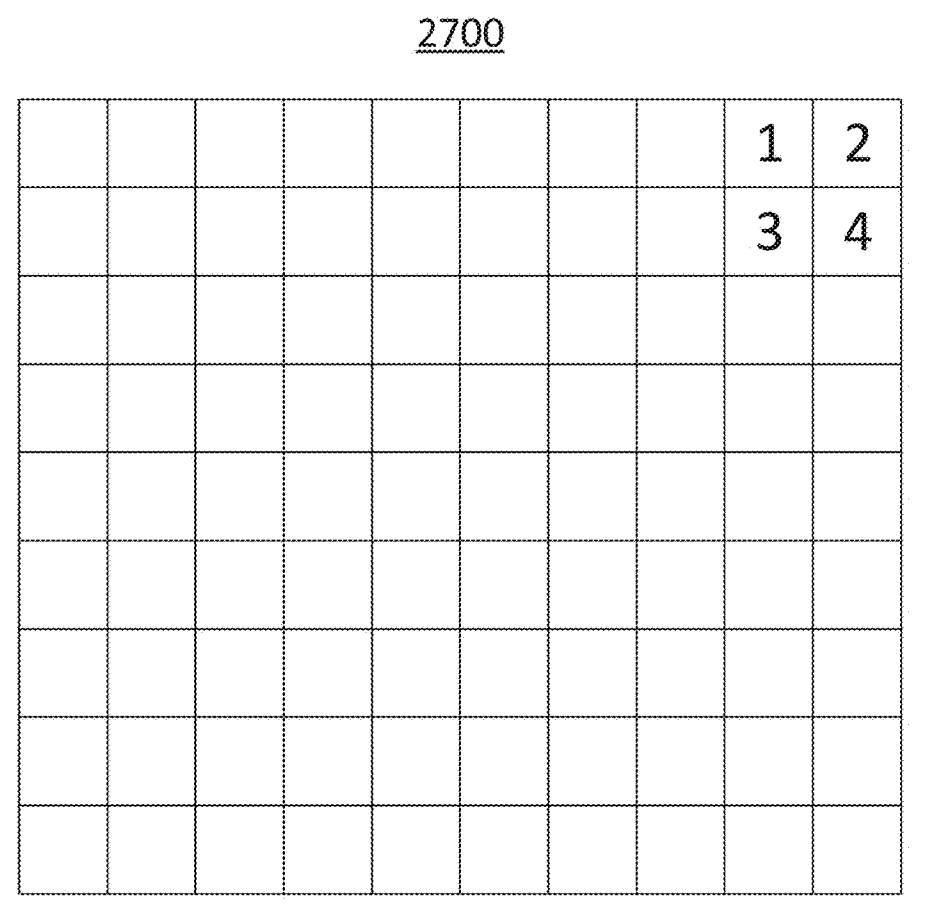

FIG. 27 illustrates an example pixel array 2700 in accordance with embodiments of the technology disclosed herein. The example pixel array 2700 may be implemented in a camera to provide filtering capabilities in the pixel domain. As described above, an image sensor may be created having a pixel array 2700 having multiple different types of pixels (e.g., traditional, filtering pixels with a derivative filter, filtering pixels with a sample-and-hold/current subtraction filter, etc.). The various pixels may be arranged in a similar fashion as used for an optical color filter, such as a Bayer filter. A Bayer filter is a color filter, where a filter is laid over the array of pixels such different wavelengths of light corresponding to red, blue, and green light are captured by individual pixels. In this way, a single traditional pixel array is capable of providing RBG images. In FIG. 27, the filtering pixel array 2700 includes a variety of different pixels. In various embodiments, pixel 1 may be a traditional pixel, pixel 2 may be a filtering pixel with a single derivative filter, pixel 3 may be a filtering pixel with a double derivative filter, and pixel 4 may be a filtering pixel with a sample-and-hold/current subtraction filter. In other embodiments, the arrangement of the pixels may differ. A person of ordinary skill in the art would understand that the pixels within the array could be arranged in a multitude of different configurations, and that more than 4 different types of pixels could be included. Nothing in this disclosure should be interpreted to limit the scope only to arrays having 4 different types of pixels arranged as illustrated. In various embodiments, each of the pixels in the array could be programmable, such that each pixel could be changed to perform a different type of filtering. For example, the pixel circuit of FIG. 21 has a programmable filter, meaning the filter can be changed by altering the digital signals that select when the various FETs are open or closed.

As used herein, the term component might describe a given unit of functionality that can be performed in accordance with one or more embodiments of the technology disclosed herein. As used herein, a component might be implemented utilizing any form of hardware, software, or a combination thereof. For example, one or more processors, controllers, ASICs, PLAs, PALs, CPLDs, FPGAs, logical components, software routines or other mechanisms might be implemented to make up a component. In implementation, the various components described herein might be implemented as discrete components or the functions and features described can be shared in part or in total among one or more components. In other words, as would be apparent to one of ordinary skill in the art after reading this description, the various features and functionality described herein may be implemented in any given application and can be implemented in one or more separate or shared components in various combinations and permutations. Even though various features or elements of functionality may be individually described or claimed as separate components, one of ordinary skill in the art will understand that these features and functionality can be shared among one or more common software and hardware elements, and such description shall not require or imply that separate hardware or software components are used to implement such features or functionality.

Figure 19:
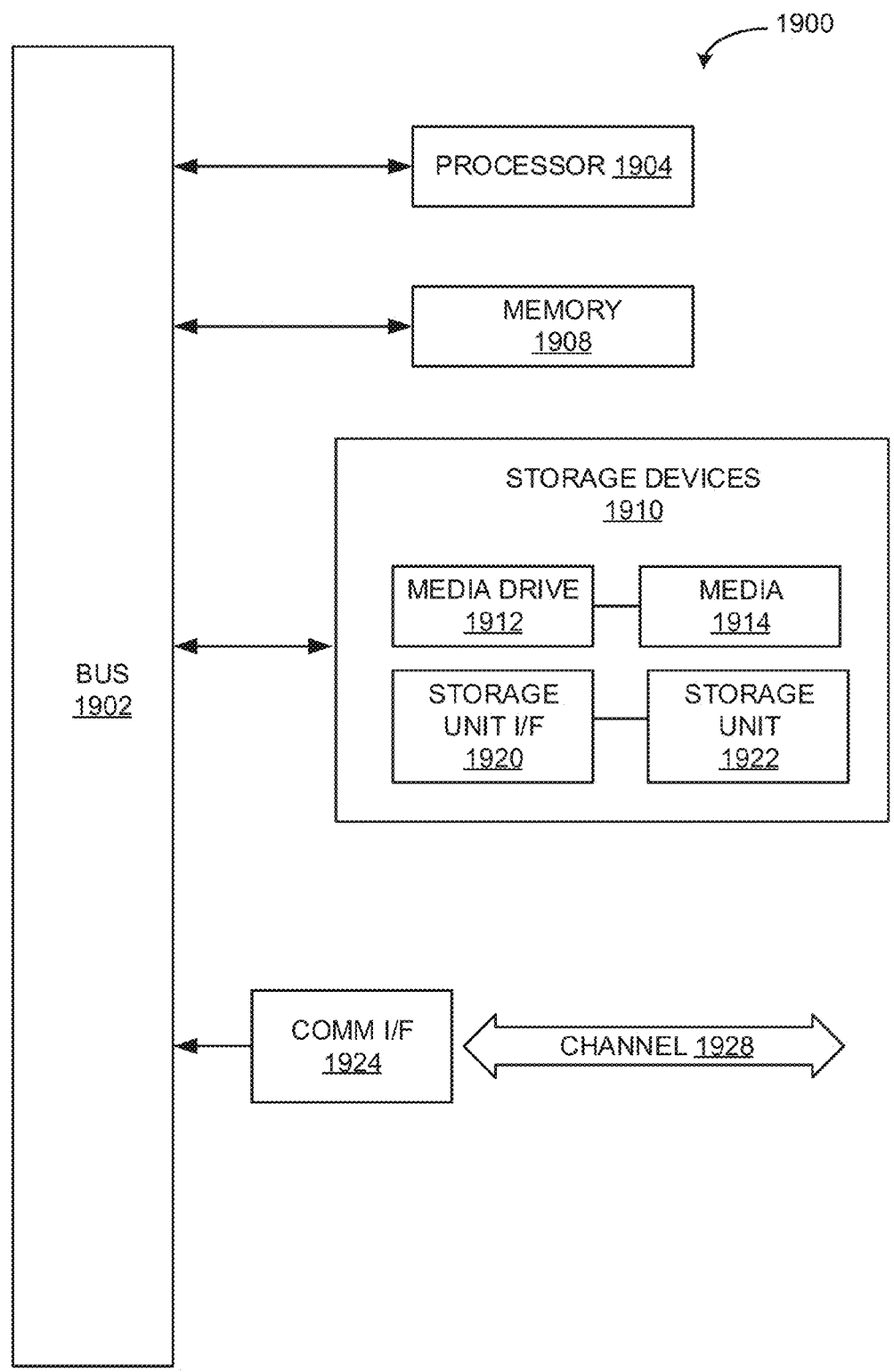
FIG. 19 illustrates an example computing component that may be used in implementing various features of embodiments of the disclosed technology.

As discussed above, some post-processing of the signal may be used in some embodiments to augment or provide additional information based on the signal outputted from the filtering pixels. Where components or components of the technology are implemented in whole or in part using software, in one embodiment, these software elements can be implemented to operate with a computing or processing component capable of carrying out the functionality described with respect thereto. One such example computing component is shown in FIG. 19. Various embodiments are described in terms of this example-computing component 1900. After reading this description, it will become apparent to a person skilled in the relevant art how to implement the technology using other computing components or architectures.

Referring now to FIG. 19, computing component 1900 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing component 1900 might also represent computing capabilities embedded within or otherwise available to a given device. For example, a computing component might be found in other electronic devices such as, for example, digital cameras, navigation systems, cellular telephones, portable computing devices, modems, routers, WAPs, terminals and other electronic devices that might include some form of processing capability.

Computing component 1900 might include, for example, one or more processors, controllers, control components, or other processing devices, such as a processor 1904. Processor 1904 might be implemented using a general-purpose or special-purpose processing engine such as, for example, a microprocessor, controller, or other control logic. In the illustrated example, processor 1904 is connected to a bus 1902, although any communication medium can be used to facilitate interaction with other components of computing component 1900 or to communicate externally.

Computing component 1900 might also include one or more memory components, simply referred to herein as main memory 1908. For example, preferably random access memory (RAM) or other dynamic memory, might be used for storing information and instructions to be executed by processor 1904. Main memory 1908 might also be used for storing temporary variables or other intermediate information during execution of instructions to be executed by processor 1904. Computing component 1900 might likewise include a read only memory ("ROM") or other static storage device coupled to bus 1902 for storing static information and instructions for processor 1904.

The computing component 1900 might also include one or more various forms of information storage mechanism 1910, which might include, for example, a media drive 1912 and a storage unit interface 1920. The media drive 1912 might include a drive or other mechanism to support fixed or removable storage media 1914. For example, a hard disk drive, a floppy disk drive, a magnetic tape drive, an optical disk drive, a CD or DVD drive (R or RW), or other removable or fixed media drive might be provided. Accordingly, storage media 1914 might include, for example, a hard disk, a floppy disk, magnetic tape, cartridge, optical disk, a CD or DVD, or other fixed or removable medium that is read by, written to or accessed by media drive 1912. As these examples illustrate, the storage media 1914 can include a computer usable storage medium having stored therein computer software or data.

In alternative embodiments, information storage mechanism 1910 might include other similar instrumentalities for allowing computer programs or other instructions or data to be loaded into computing component 1900. Such instrumentalities might include, for example, a fixed or removable storage unit 1922 and an interface 1920. Examples of such storage units 1922 and interfaces 1920 can include a program cartridge and cartridge interface, a removable memory (for example, a flash memory or other removable memory component) and memory slot, a PCMCIA slot and card, and other fixed or removable storage units 1922 and interfaces 1920 that allow software and data to be transferred from the storage unit 1922 to computing component 1900.

Computing component 1900 might also include a communications interface 1924. Communications interface 1924 might be used to allow software and data to be transferred between computing component 1900 and external devices. Examples of communications interface 1924 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 1924 might typically be carried on signals, which can be electronic, electromagnetic (which includes optical) or other signals capable of being exchanged by a given communications interface 1924. These signals might be provided to communications interface 1924 via a channel 1928. This channel 1928 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 1908, storage unit 1920, media 1914, and channel 1928. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing component 1900 to perform features or functions of the disclosed technology as discussed herein.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent component names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "component" does not imply that the components or functionality described or claimed as part of the component are all configured in a common package. Indeed, any or all of the various components of a component, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An apparatus, comprising:
   an array of filtering pixels, each filtering pixel comprising:
   a photodiode;
   a filter circuit;
   a read out field-effect transistor (FET);
   a read bus for reading an output of each filtering pixel of the array of filtering pixels; and
   each filtering pixel further comprising an additional read out FET and an additional read bus is configured to output a signal proportional to the intensity of light falling on the photodiode.

2. The apparatus of claim 1, wherein the array of filtering pixels comprises one or more derivative pixels, the filter circuit comprising a first differentiator configured to output a signal proportional to a change in intensity of light falling on the photodiode.

3. The apparatus of claim 2, the first differentiator comprising:
   a capacitor;
   a resistor; and
   a field-effect transistor.

4. The apparatus of claim 2, each derivative pixel further comprising a reset FET configured to enable setting a voltage of the photodiode equivalent to a drain voltage of the system.

5. The apparatus of claim 2, each derivative pixel further comprising a buffer electrically disposed between the photodiode and the derivative sensing circuit.

6. The apparatus of claim 5, wherein the buffer comprises:
   a buffer FET; and
   a preliminary differentiator configured to output a signal proportional to an intensity of light falling on the photodiode.

7. The apparatus of claim 5, each derivative pixel further comprising a second differentiator configured to output a signal proportional to a change in the change in intensity of light falling on the photodiode, the second differentiator electrically disposed after the first differentiator.

8. The apparatus of claim 7, wherein the read bus is configured for reading out an output of the second differentiator, and each derivative pixel further comprises a second read out FET and a second read out bus for reading out an output of the first differentiator.

9. The apparatus of claim 2, each derivative pixel further comprising a second differentiator configured to output a signal proportional to a change in the change in intensity of light falling on the photodiode, the second differentiator electrically disposed after the first differentiator.

10. The apparatus of claim 9, wherein the read bus is configured for reading out an output of the second differentiator, and each derivative pixel further comprises a second read out FET and second read out bus for reading out an output of the first differentiator.

11. The apparatus of claim 1, each filtering pixel further comprising an integrator, wherein the integrator comprises a capacitor.

12. The apparatus of claim 1, each filtering pixel further comprising a third read out FET and a third read bus configured to output a signal proportional to the intensity of light falling on the photodiode.

13. A method of derivative sensing, comprising:
sensing a change in intensity of light falling on a photodiode of a derivative pixel of an array of derivative pixels;
taking, by a differentiator, a derivative of a signal proportional to an intensity of light falling on the photodiode;
integrating the derivative signal; and
reading out the integrated signal on a read bus;
outputting, by each derivate pixel, a signal proportional to the intensity of light falling on the photodiode of the derivative pixel, each derivate pixel comprising an additional read out FET and an additional read bus.

14. The method of claim 13, wherein the differentiator comprises:
a capacitor;
a resistor; and
a field-effect transistor.

15. The method of claim 13, further comprising storing, by a buffer field effect transistor, a signal proportional to an integral of the intensity of light falling on the photodiode.

16. The method of claim 13, further comprising taking a second derivative of the signal by a second differentiator disposed after the first differentiator.

17. The method of claim 16, the second differentiator comprising:
a second capacitor;
a second resistor; and
a second field-effect transistor.

18. The method of claim 16, wherein the integrated signal comprises an output of the second differentiator integrated by an integrator, wherein the integrator comprises a capacitor.

19. The method of claim 18, further comprising integrating an output of the first differentiator, and reading out the integrated output of the first differentiator on a second read out bus.

* * * * *